US 12,417,801 B2
Sep. 16, 2025

(12) United States Patent
Hirose

(10) Patent No.: US 12,417,801 B2
(45) Date of Patent: Sep. 16, 2025

(54) 2-PORT SRAM COMPRISING A CFET

(71) Applicant: Socionext Inc., Kanagawa (JP)

(72) Inventor: Masanobu Hirose, Kanagawa (JP)

(73) Assignee: SOCIONEXT INC., Kanagawa (JP)

( * ) Notice: Subject to any disclaimer, the term of this patent is extended or adjusted under 35 U.S.C. 154(b) by 124 days.

(21) Appl. No.: 18/413,959

(22) Filed: Jan. 16, 2024

(65) Prior Publication Data

US 2024/0153549 A1    May 9, 2024

Related U.S. Application Data

(60) Division of application No. 17/556,268, filed on Dec. 20, 2021, now Pat. No. 11,915,744, which is a continuation of application No. PCT/JP2020/020976, filed on May 27, 2020.

(30) Foreign Application Priority Data

Jun. 21, 2019    (JP) ................................ 2019-115209

(51) Int. Cl.
G11C 11/412    (2006.01)
G11C 11/419    (2006.01)
H10B 10/00    (2023.01)

(52) U.S. Cl.
CPC .......... *G11C 11/412* (2013.01); *G11C 11/419* (2013.01); *H10B 10/12* (2023.02); *H10B 10/125* (2023.02)

(58) Field of Classification Search
CPC ....... G11C 11/412; G11C 11/419; G11C 8/16; H10B 10/12; H10B 10/125; H10D 88/00; H10D 89/10
USPC .......................................................... 365/181
See application file for complete search history.

(56) References Cited

U.S. PATENT DOCUMENTS

| 5,517,038 A | 5/1996 | Maeda et al. |
| 7,057,963 B2 * | 6/2006 | Yang ........................ G11C 8/16 365/189.04 |
| 9,362,292 B1 | 6/2016 | Liaw |
| 10,707,218 B2 | 7/2020 | Paul et al. |
| 2003/0090924 A1 | 5/2003 | Nii |

(Continued)

FOREIGN PATENT DOCUMENTS

| JP | H06-061452 A | 3/1994 |
| JP | 2003-218238 A | 7/2003 |

(Continued)

OTHER PUBLICATIONS

International Search Report issued in International Patent Application No. PCT/JP2020/020976, dated Aug. 4, 2020; with English translation.

(Continued)

*Primary Examiner* — Ly D Pham
(74) *Attorney, Agent, or Firm* — Rimon P.C.

(57) ABSTRACT

Transistors (N1 to N12) corresponding to drive transistors (PD1, PD2), access transistors (PG1, PG2), read drive transistor (RPD1), and read access transistor (RPG1) are (Continued)

formed in a lower portion of a cell. Transistors (P1, P2) corresponding to load transistors (PU1, PU2), respectively, are formed in an upper portion of the cell. The transistors (P1, P2) overlap the transistors (N3, N8), respectively, in plan view.

8 Claims, 16 Drawing Sheets

(56) References Cited

U.S. PATENT DOCUMENTS

| | | | |
|---|---|---|---|
| 2008/0247221 A1* | 10/2008 | Houston | G11C 11/412 365/189.14 |
| 2009/0161410 A1* | 6/2009 | Houston | G11C 11/412 365/189.14 |
| 2013/0176771 A1* | 7/2013 | Chang | H10D 89/10 365/154 |
| 2013/0181274 A1 | 7/2013 | Saitoh et al. | |
| 2015/0325444 A1 | 11/2015 | Masuoka et al. | |
| 2016/0358646 A1* | 12/2016 | Liaw | H10B 10/12 |
| 2022/0093613 A1 | 3/2022 | Moriwaki | |
| 2022/0108992 A1 | 4/2022 | Yamagami | |
| 2022/0115389 A1 | 4/2022 | Hirose | |

FOREIGN PATENT DOCUMENTS

| | | |
|---|---|---|
| JP | 2013-143536 A | 7/2013 |
| WO | 2014/184933 A1 | 11/2014 |
| WO | 2014/185085 A1 | 11/2014 |

OTHER PUBLICATIONS

Written Opinion of International Researching Authority issued in International Patent Application No. PCT/JP2020/020976, dated Aug. 4, 2020; with English translation.

Ryckaert J. et al., "The Complementary FET (CFET) for CMOS scaling beyond N3", 2018 Symposium on VLSI Technology Digest of Technical Papers; pp. 141-142.

A. Mocuta et al., "Enabling CMOS Scaling Towards 3nm and Beyond", 2018 Symposium on VLSI Technology Digest of Technical Papers; pp. 147-148.

Notice of Allowance dated Oct. 25, 2023 issued in U.S. Appl. No. 17/556,268.

* cited by examiner

US 12,417,801 B2

2-PORT SRAM COMPRISING A CFET

CROSS-REFERENCE TO RELATED APPLICATIONS

This is a Divisional of U.S. patent application Ser. No. 17/556,268, filed on Dec. 20, 2021, which is a Continuation of International Application No. PCT/JP2020/020976, filed on May 27, 2020, which claims priority to Japanese Patent Application No. 2019-115209, filed on Jun. 21, 2019. The entire disclosures of these applications are incorporated by reference herein.

BACKGROUND

The present disclosure relates to a semiconductor memory device having a three-dimensional transistor, and in particular, relates to a layout configuration of a 2-port static random access memory (SRAM) cell using a three-dimensional transistor.

BACKGROUND ART

An SRAM is a widely used semiconductor integrated circuit. As an SRAM, there is a 2-port SRAM having one port for writing and one port for reading (for example, Patent Document 1).

Further, the gate length of a transistor which is a basic component of an LSI has been reduced (scaling) to improve integration degree, reduce the operating voltage, and improve the operating speed. However, an off-current due to excessive scaling and a significant increase in power consumption due to the off-current have been concerned in recent years. To address these concerns, studies have been actively conducted for a transistor having a three-dimensional configuration (hereinafter, three-dimensional transistor) in which a configuration of a transistor is changed from a traditional planar type to a three-dimensional type.

Non-Patent Documents 1 and 2 disclose, as a novel device, a three dimensional device in which a P-type FET and an N-type FET each having a three-dimensional configuration are stacked in a direction perpendicular to a substrate, and an SRAM cell (hereinafter, also simply referred to as cell) using such a three-dimensional device.

CITATION LIST

Patent Document

Patent Document 1: U.S. Pat. No. 9,362,292 (FIG. 1)

Non-Patent Documents

Non-Patent Documents 1: Ryckaert J. et al., "The Complementary FET (CFET) for CMOS scaling beyond N3", 2018 Symposium on VLSI Technology Digest of Technical Papers Non-Patent Documents 2: A. Mocuta et al., "Enabling CMOS Scaling Towards 3 nm and Beyond", 2018 Symposium on VLSI Technology Digest of Technical Papers SUMMARY OF THE INVENTION

Technical Problem

A three dimensional device having a three-dimensional P-type FET and a three-dimensional N-type FET stacked perpendicularly to a substrate is referred to as a CFET (Complementary FET) in this specification, as in the description of Non-Patent Document 1. Further, a direction perpendicular to the substrate is referred to as a depth direction.

To date, however, no specific consideration has been given as to the layout of the 2-port SRAM cell using the CFET.

An object of the present disclosure is to provide a layout configuration of a 2-port SRAM cell using the CFET.

Solution to the Problem

A first aspect of the present disclosure is a semiconductor memory device including a 2-port SRAM cell, the 2-port SRAM cell including: a first transistor having one node connected to a first power source that supplies a first voltage, another node connected to a first node, and a gate connected to a second node; a second transistor having one node connected to the first power source, another node connected to the second node, and a gate connected to the first node; a third transistor having one node connected to the first node, another node connected to a second power source that supplies a second voltage different from the first voltage, and a gate connected to the second node; a fourth transistor having one node connected to the second node, another node connected to the second power source, and a gate connected to the first node; a fifth transistor having one node connected to a first write-bit line, another node connected to the first node, and a gate connected to a write-word line; a sixth transistor having one node connected to a second write-bit line constituting a complementary bit line pair with the first write-bit line, another node connected to the second node, and a gate connected to the write-word line; a seventh transistor having one node connected to the second power source, and a gate connected to the second node; and an eighth transistor having one node connected to the other node of the seventh transistor, another node connected to a read-bit line, and a gate connected to a read-word line. Each of the third to sixth transistors is a three-dimensional transistor of a first conductive type formed in a first layer. Each of the first and second transistors is a three-dimensional transistor of a second conductive type different from the first conductive type, the three-dimensional transistor being formed in a second layer different from the first layer, and the first and second transistors at least partially overlapping the third and fourth transistors in plan view, respectively. The seventh and eighth transistors include the three-dimensional transistor of the first conductive type formed in the first layer, and are arranged to align in a first direction that is a direction in which channel portions of the first to eighth transistors extend.

According to the present disclosure, a 2-port SRAM circuit is configured by the first to eighth transistors. Each of the third to sixth transistors is a three-dimensional transistor of the first conductive type formed in the first layer. Each of the first and second transistors is a three-dimensional transistor of the second conductive type formed in the second layer. Each of the seventh and eighth transistors is a three-dimensional transistor of the first conductive type formed in the first layer. That is, the first to eighth transistors constituting the 2-port SRAM circuit are configured by the three-dimensional transistors. Thus, a 2-port SRAM cell using a CFET can be achieved.

The first and second transistors at least partially overlap the third and fourth transistors in plan view, respectively. That is, the first and second transistors are stacked on the third and the fourth transistors, respectively. Further, the seventh and eighth transistors are arranged to align in the first direction. This way, the area of the 2-port SRAM cell can be reduced.

Thus, a 2-port SRAM cell using a CFET can be achieved, and the area of the 2-port SRAM cell can be reduced.

A second aspect of the present disclosure is a semiconductor memory device including a 2-port SRAM cell, the 2-port SRAM cell including: a first transistor having one node connected to a first power source that supplies a first voltage, another node connected to a first node, and a gate connected to a second node; a second transistor having one node connected to the first power source, another node connected to the second node, and a gate connected to the first node; a third transistor having one node connected to the first node, another node connected to a second power source that supplies a second voltage different from the first voltage, and a gate connected to the second node; a fourth transistor having one node connected to the second node, another node connected to the second power source, and a gate connected to the first node; a fifth transistor having one node connected to a first write-bit line, another node connected to the first node, and a gate connected to a write-word line; a sixth transistor having one node connected to a second write-bit line constituting a complementary bit line pair with the first write-bit line, another node connected to the second node, and a gate connected to the write-word line; a seventh transistor having one node connected to the first power source, and a gate connected to the second node; and an eighth transistor having one node connected to the other node of the seventh transistor, another node connected to a read-bit line, and a gate connected to a read-word line. Each of the third to sixth transistors is a three-dimensional transistor of a first conductive type formed in a first layer. Each of the first and second transistors is a three-dimensional transistor of a second conductive type different from the first conductive type, the three-dimensional transistor being formed in a second layer different from the first layer, and the first and second transistors at least partially overlapping the third and fourth transistors in plan view, respectively. The seventh and eighth transistors include the three-dimensional transistor of the second conductive type formed in the second layer, and are arranged to align in a first direction that is a direction in which channel portions of the first to eighth transistors extend.

According to the present disclosure, a 2-port SRAM circuit is configured by the first to eighth transistors. Each of the third to sixth transistors is a three-dimensional transistor of the first conductive type formed in the first layer. Each of the first and second transistors is a three-dimensional transistor of the second conductive type formed in the second layer. Each of the seventh and eighth transistors includes a three-dimensional transistor of the second conductive type formed in the second layer. That is, the first to eighth transistors constituting the 2-port SRAM circuit are configured by the three-dimensional transistors. Thus, a 2-port SRAM cell using a CFET can be achieved.

The first and second transistors at least partially overlap the third and fourth transistors in plan view, respectively. That is, the first and second transistors are stacked on the third and the fourth transistors, respectively. Further, the seventh and eighth transistors are arranged to align in the first direction. This way, the area of the 2-port SRAM cell can be reduced.

Thus, a 2-port SRAM cell using a CFET can be achieved, and the area of the 2-port SRAM cell can be reduced.

A third aspect of the present disclosure is a semiconductor memory device including a 2-port SRAM cell, the 2-port SRAM cell including: a first transistor having one node connected to a first power source that supplies a first voltage, another node connected to a first node, and a gate connected to a second node; a second transistor having one node connected to the first power source, another node connected to the second node, and a gate connected to the first node; a third transistor having one node connected to the first node, another node connected to a second power source that supplies a second voltage different from the first voltage, and a gate connected to the second node; a fourth transistor having one node connected to the second node, another node connected to the second power source, and a gate connected to the first node; a fifth transistor having one node connected to a first write-bit line, another node connected to the first node, and a gate connected to a write-word line; a sixth transistor having one node connected to a second write-bit line constituting a complementary bit line pair with the first write-bit line, another node connected to the second node, and a gate connected to the write-word line; a seventh transistor having one node connected to the first power source or the second power source, and a gate connected to the second node; and an eighth transistor having one node connected to the other node of the seventh transistor, another node connected to a read-bit line, and a gate connected to a read-word line. Each of the third to sixth transistors includes a first three-dimensional transistor that is a three-dimensional transistor of a first conductive type formed in a first layer, and a second three-dimensional transistor that is a three-dimensional transistor of a first conductive type formed in a second layer different from the first layer so that the second three-dimensional transistor at least partially overlaps the first three-dimensional transistor in plan view. Each of the first and second transistors includes a three-dimensional transistor of a second conductive type different from the first conductive type formed in the second layer. Each of the seventh and eighth transistors includes a third three-dimensional transistor that is a three-dimensional transistor of the first or second conductive type formed in the first layer, and a fourth three-dimensional transistor that is a three-dimensional transistor formed in the second layer so that the fourth three-dimensional transistor at least partially overlaps the third three-dimensional transistor in plan view, the fourth three-dimensional transistor having a conductive type identical to that of the third three-dimensional transistor.

According to the present disclosure, a 2-port SRAM circuit is configured by the first to eighth transistors. Each of the third to sixth transistors includes the first three-dimensional transistor that is the three-dimensional transistor of the first conductive type formed in the first layer, and the second three-dimensional transistor that is the three-dimensional transistor of the first conductive type formed in the second layer. Each of the first and second transistors includes the three-dimensional transistor of the second conductive type formed in the second layer. Each of the seventh and eighth transistors includes the third three-dimensional transistor that is the three-dimensional transistor of the first or second conductive type formed in the first layer, and the fourth three-dimensional transistor that is the three-dimensional transistor formed in the second layer and having a conductive type identical to that of the third three-dimensional transistor. That is, the first to eighth transistors constituting the 2-port SRAM circuit are configured by the three-dimensional transistors. Thus, a 2-port SRAM cell using a CFET can be achieved.

Further, the first three-dimensional transistor at least partially overlaps the second three-dimensional transistor in plan view. The third three-dimensional transistor at least partially overlaps the fourth three-dimensional transistor in plan view. That is, the first and second three-dimensional transistors constituting the third to sixth transistors are stacked. The third and fourth three-dimensional transistors constituting the seventh and eighth transistors are stacked. This way, the area of the 2-port SRAM cell can be reduced.

Thus, a 2-port SRAM cell using a CFET can be achieved, and the area of the 2-port SRAM cell can be reduced.

A fourth aspect of the present disclosure is a semiconductor memory device including a 2-port SRAM cell, the 2-port SRAM cell including: a first transistor having one node connected to a first power source that supplies a first voltage, another node connected to a first node, and a gate connected to a second node; a second transistor having one node connected to the first power source, another node connected to the second node, and a gate connected to the first node; a third transistor having one node connected to the first node, another node connected to a second power source that supplies a second voltage different from the first voltage, and a gate connected to the second node; a fourth transistor having one node connected to the second node, another node connected to the second power source, and a gate connected to the first node; a fifth transistor having one node connected to a first write-bit line, another node connected to the first node, and a gate connected to a write-word line; a sixth transistor having one node connected to a second write-bit line constituting a complementary bit line pair with the first write-bit line, another node connected to the second node, and a gate connected to the write-word line; a seventh transistor having one node connected to the first power source, and a gate connected to the second node; and an eighth transistor having one node connected to the other node of the seventh transistor, another node connected to a read-bit line, and a gate connected to a read-word line. Each of the third to sixth transistors is a three-dimensional transistor of a first conductive type formed in a first layer. Each of the first and second transistors includes a three-dimensional transistor of a second conductive type different from the first conductive type formed in a second layer different from the first layer. The seventh transistor includes a three-dimensional transistor of the second conductive type formed in the second layer, and at least partially overlaps the third transistor in plan view. The eighth transistor includes a three-dimensional transistor of the second conductive type formed in the second layer, and is arranged to align with the seventh transistor in a second direction perpendicular to a first direction that is a direction in which channel portions of the first to eighth transistors extend.

According to the present disclosure, a 2-port SRAM circuit is configured by the first to eighth transistors. Each of the third to sixth transistors is a three-dimensional transistor of the first conductive type formed in the first layer. Each of the first and second transistors includes the three-dimensional transistor of the second conductive type formed in the second layer. Each of the seventh and eighth transistors includes a three-dimensional transistor of the second conductive type formed in the second layer. Thus, a 2-port SRAM cell using a CFET can be achieved.

Further, the seventh transistor at least partially overlaps the third transistor in plan view. That is, the seventh transistor is stacked on the third transistor. The eighth transistor is arranged to align with the seventh transistor in the second direction. This way, the area of the 2-port SRAM cell can be reduced.

Thus, a 2-port SRAM cell using a CFET can be achieved, and the area of the 2-port SRAM cell can be reduced.

Advantages of the Invention

With the present disclosure, a 2-port SRAM cell using a CFET can be achieved, and the area of the 2-port SRAM cell can be reduced.

DESCRIPTION OF EMBODIMENTS

Embodiments will be described in detail with reference to the drawings. The following embodiments assume that a semiconductor memory device includes a plurality of SRAM cells (simply referred to as cells as appropriate, in this specification), and that at least a part of the plurality of SRAM cells includes a CFET, that is, a three dimensional device in which a P-type FET and an N-type FET each having a three-dimensional configuration are perpendicularly stacked on a substrate.

Figure 13:
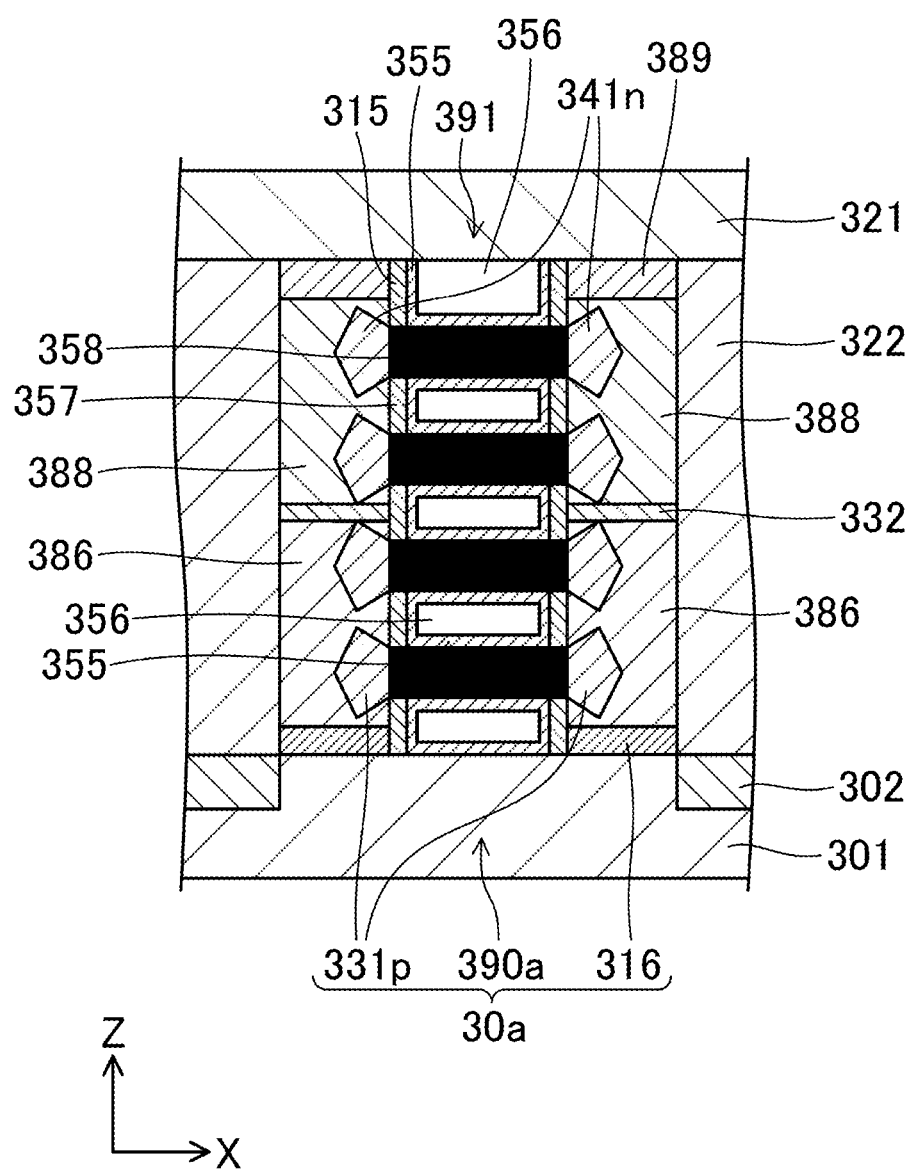
FIG. 13 is a cross-sectional view showing a configuration of a semiconductor device including a CFET.
Figure 14:
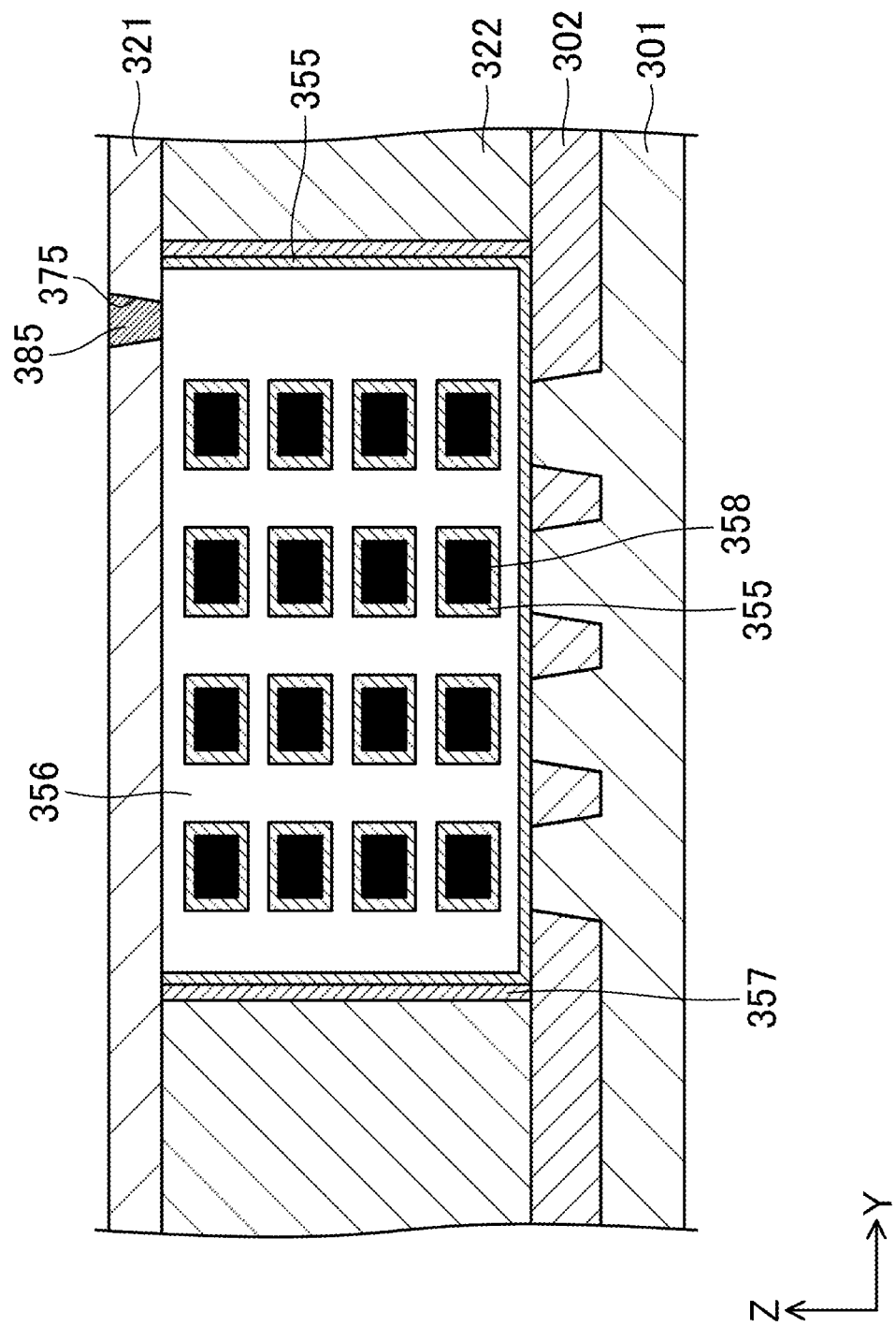
FIG. 14 is a cross-sectional view showing a configuration of a semiconductor device including a CFET.
Figure 15:
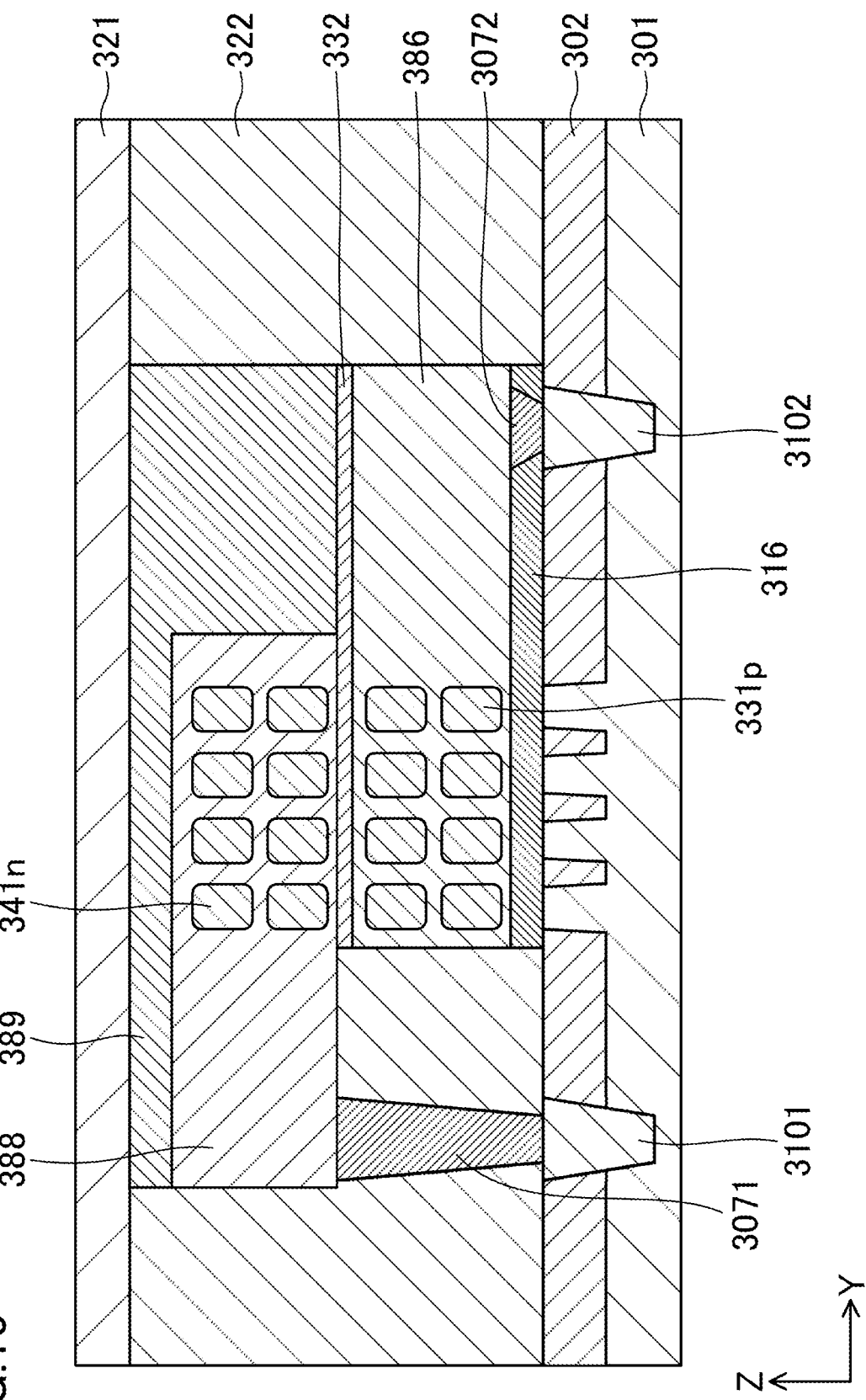
FIG. 15 is a cross-sectional view showing a configuration of a semiconductor device including a CFET.
Figure 16:
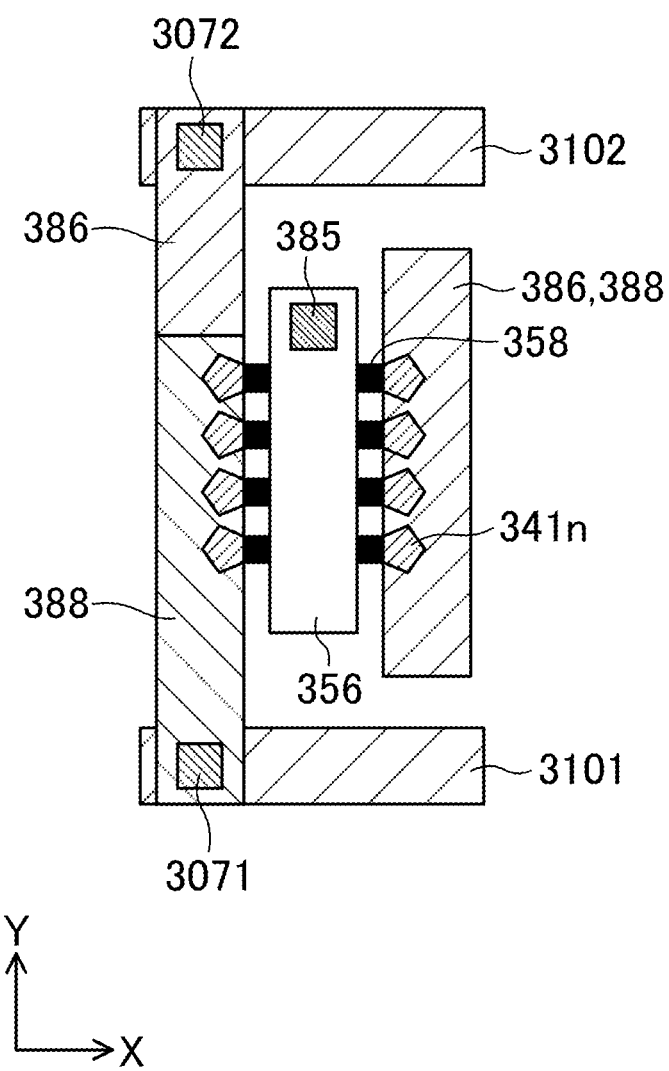
FIG. 16 is a cross-sectional view showing a configuration of a semiconductor device including a CFET.

First, the basic configuration of the CFET will be described. FIGS. 13 to 16 are views showing a configuration of a semiconductor device including a CFET. FIG. 13 is a cross-sectional view taken along the X direction. FIG. 14 is a cross-sectional view of a gate portion, taken along the Y direction. FIG. 15 is a cross-sectional view of a source/drain portion, taken along the Y direction. FIG. 16 is a plan view. The X direction is a direction in which a nanowire extends. The Y direction is a direction in which a gate extends. The Z direction is the direction perpendicular to the substrate surface. Further, FIGS. 13 to 15 are each a schematic view, and dimensions, positions, and the like of the parts do not necessarily have to be consistent.

In this semiconductor device, an element isolation region 302 is formed on a surface of a semiconductor substrate 301 such as a silicon (Si) substrate. This element isolation region 302 defines an element active region 30a. In the element active region 30a, an N-type FET is formed on a P-type FET.

In the element active region 30a, a stacked transistor configuration 390a is formed on the semiconductor substrate 301. The stacked transistor configuration 390a includes a gate configuration 391 formed on the semiconductor substrate 301. The gate configuration 391 includes a gate electrode 356, a plurality of nanowires 358, gate insulating films 355, and insulating films 357. The gate electrode 356 extends in the Y direction and rises in the Z direction. The nanowires 358 penetrate the gate electrode 356 in the X direction and are aligned in the Y direction and the Z direction. Each of the gate insulating films 355 is formed between the gate electrode 356 and the nanowire 358. The gate electrode 356 and the gate insulating film 355 are formed at positions recessed in the X direction from both ends of the nanowire 358, and the insulating films 357 are formed at the recessed portions. On the semiconductor substrate 301, insulating films 316 are formed on a side of the insulating film 357 on both sides. Reference character 321 and 322 each denote an interlayer insulating film.

Further, as shown in FIG. 14, the gate electrode 356 is connected to a wire in an upper layer through a via 385 provided in an opening 375.

For example, the gate electrode 356 may be made of titanium, titanium nitride or polycrystalline silicon. For example, the gate insulating film 355 may be made of a high dielectric constant material such as hafnium oxide, aluminum oxide, or an oxide of hafnium and aluminum. For example, the nanowires 358 may be made of silicon, and the like. For example, the insulating film 316 and the insulating film 357 may be made of silicon oxide, silicon nitride, or the like.

In this semiconductor device, four nanowires 358 are aligned in the Z direction. In the element active region 30a, a P-type semiconductor layer 331p is formed at each end portion of two nanowires 358 closer to the semiconductor substrate 301. Two local interconnects 386 in contact with the P-type semiconductor layers 331p are formed so as to sandwich the gate configuration 391 in the X direction. Further, an N-type semiconductor layer 341n is formed to each end portion of two nanowires 358 far from the semiconductor substrate 101. Two local interconnects 388 in contact with the N-type semiconductor layers 341n are formed so as to sandwich the gate configuration 391 in the X direction. Between the local interconnects 386 and the local interconnects 388, insulating films 332 are formed. On the local interconnect 388, insulating films 389 are formed. For example, the P-type semiconductor layer 33ip is a p-type SiGe layer, and the N-type semiconductor layer 341n is an n-type Si layer. For example, the insulating films 332 may be made of silicon oxide, silicon nitride, and the like.

Further, as shown in FIG. 15, the local interconnects 388 are connected to a buried line 3101 through a via 3071. The local interconnects 386 are connected to a buried line 3102 through a via 3072.

As described, the stacked transistor configuration 390a has the P-type FET including the gate electrode 356, the nanowires 358, the gate insulating films 355 and the P-type semiconductor layers 331p. In this P-type FET, each P-type semiconductor layer 331p on one side serves as the source region, and each P-type semiconductor layer 331p on the other side serves as the drain region. Each of the nanowires 358 serves as a channel. The stacked transistor configuration 390a also has the N-type FET including the gate electrode 356, the nanowires 358, the gate insulating films 355, and the N-type semiconductor layers 341n. In this N-type FET, each N-type semiconductor layer 341n on one side serves as the source region, and each N-type semiconductor layer 341n on the other side serves as the drain region. Each of the nanowires 358 serves as a channel.

As to the layers above the stacked transistor configuration, vias and metal wires provide wiring and the like between transistors, which is achievable by a known wiring process.

It should be noted that the number of nanowires in each of the P-type FET and the N-type FET is four in the Y direction and two in the Z direction, that is, eight in total. However, the number of nanowires is not limited to this. The number of nanowires in the P-type FET and that in the N-type FET may be different from each other.

Further, the semiconductor layer portion that is formed at each end of the nanowire and that constitutes a terminal to serve as the source or the drain of the transistor is referred to as "pad." In the above-described basic configuration of the CFET, the P-type semiconductor layer 331p and the N-type semiconductor layer 341n correspond to the pad.

Further, the plan views and cross-sectional views referenced in the description of embodiments below may omit insulating films. Further, the plan views and cross-sectional views referenced in the description of embodiments below may illustrate the nanowires and pads on both sides of the nanowires in the form of a simplified linear shape. Further, the expression "the same size" and the like in this specification indicating that the size and the like are the same encompasses a range of variation in manufacturing.

Further, the source and drain of the transistor is referred to as "node" of the transistor where appropriate in this specification. That is, one node of a transistor indicates the source or the drain of the transistor, and both nodes of a transistor indicate the source and the drain of the transistor.

Further, this specification basically deals with a case where a P-type FET and an N-type FET are stacked; however, there is a part where the P-type FET or the N-type FET is formed only in an upper layer (or a lower layer). As a formation method, for example, after a device of an upper layer (or a lower layer) is formed, a P-type FET or the N-type FET may be formed only in the upper layer (or the lower layer) by partially removing the device of the upper layer (or the lower layer) through, for example, removal of a pad portion or removal of a gate wire or the pad portion. Alternatively, the P-type FET or the N-type FET may be formed only in an upper layer (or a lower layer) by partially not forming the upper layer (or the lower layer) at a time of forming the pad portion of the device in the upper layer (or the lower layer) through epitaxial growth.

Further, this specification basically deals with a case where a P-type FET and an N-type FET are stacked; however, there is a part where FETs of the identical conductive type (P-type FET or N-type FET) are formed in both an upper layer and a lower layer. That is, an FET of a different conductive type may be formed in at least one of the upper layer or the lower layer. As a formation method thereof, for example, in a case of forming an N-type FET (or a P-type FET) in a part of the upper layer (or the lower layer), a portion where the N-type FET (or the P-type FET) is formed is masked and the other portion is doped to the P-conductive type (or N-conductive type). Then, the portion other than the portion where the N-type FET is formed is masked, and the unmasked portion is doped to the N-conductive type (or P-conductive type). This way, an FET of a different conductive type is formed in at least one of the upper layer or the lower layer, and the FETs of the identical conductive type can be reliably stacked.

In the following embodiments, "VDD" and "VSS" are used to indicate a voltage or a power source itself.

Further, in the following embodiments and variations thereof, the same reference characters are used to represent equivalent elements, and the detailed explanation thereof will be omitted.

First Embodiment

Figure 1:
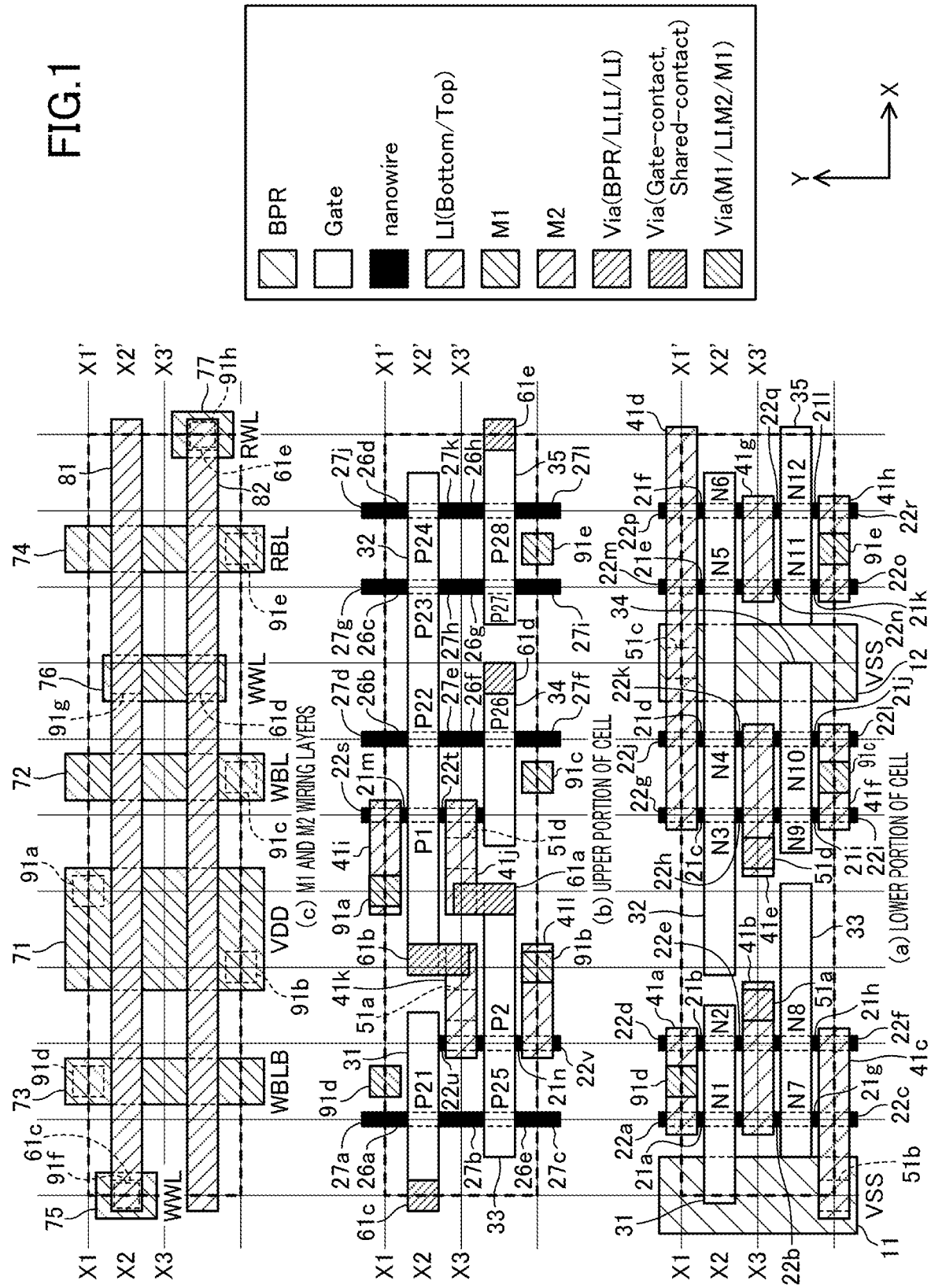
FIG. 1 is a plan view showing an exemplary layout configuration of a 2-port SRAM cell related to a first embodiment.
Figure 2:
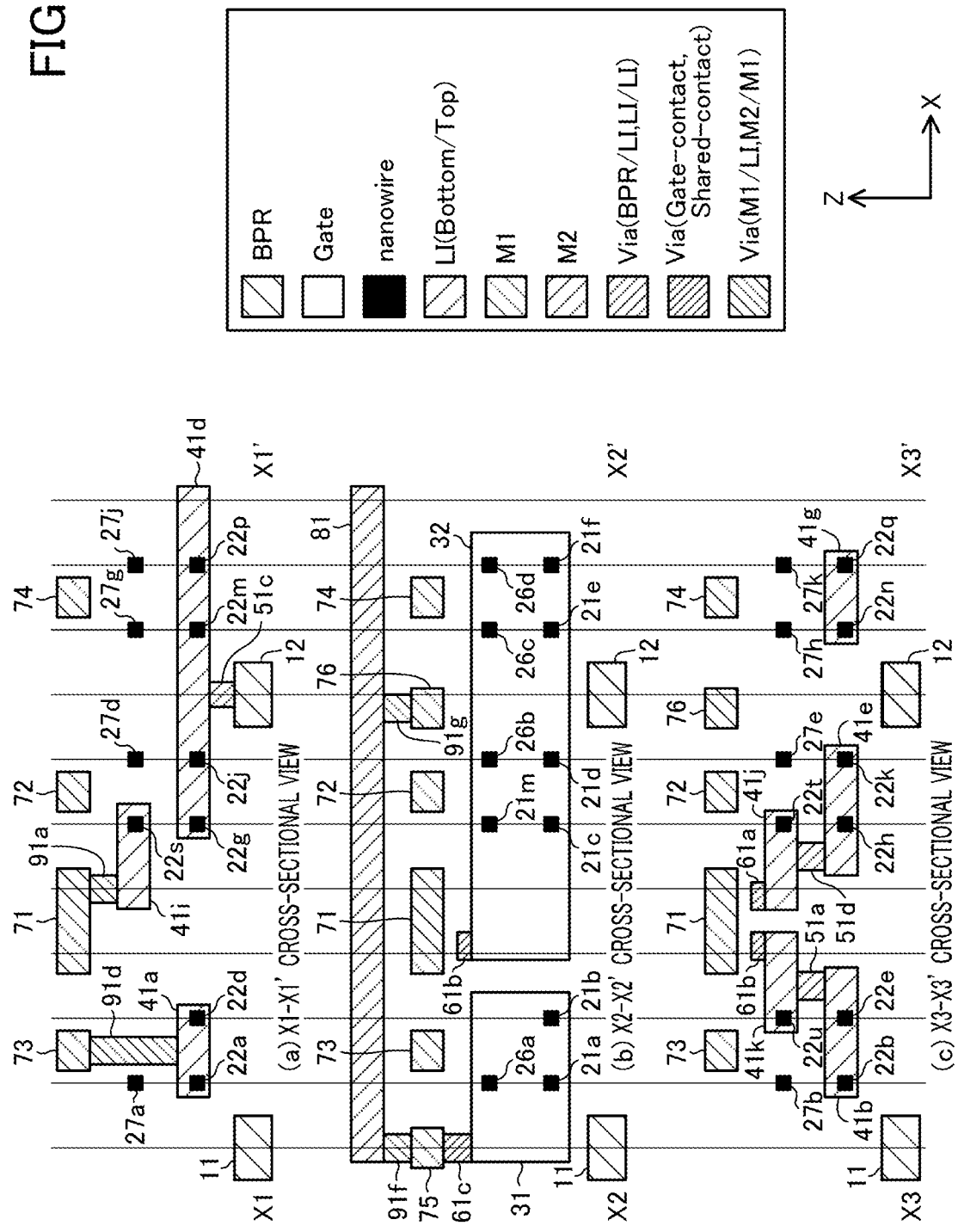
FIG. 2 is a cross-sectional view showing the exemplary layout configuration of the 2-port SRAM cell related to the first embodiment.

FIG. 1 and FIG. 2 are each a plan view showing an exemplary layout configuration of a 2-port SRAM cell related to a first embodiment, and illustrations (a) to (c) of FIG. 1 and illustrations (a) to (c) of FIG. 2 are each a cross-sectional view seen from a lateral direction in plan view. Specifically, the illustration (a) of FIG. 1 shows a portion including a three-dimensional transistor (here, an N-type nanowire FET) formed in the lower portion, that is, on the side closer to the substrate. The illustration (b) of FIG. 1 shows a portion including a three-dimensional transistor (here, a P-type nanowire FET) formed in the upper portion, that is, on the side distant from the substrate. The illustration (c) of FIG. 1 shows M1 and M2 wiring layers, that is, the metal wiring layers above the portion where the three-dimensional transistor is formed. The illustration (a) of FIG. 2 is a cross section taken along line X1-X1', the illustration (b) of FIG. 2 is a cross section taken along line X2-X2', and the illustration (c) of FIG. 2 is a cross section taken along line X3-X3'.

Figure 3:
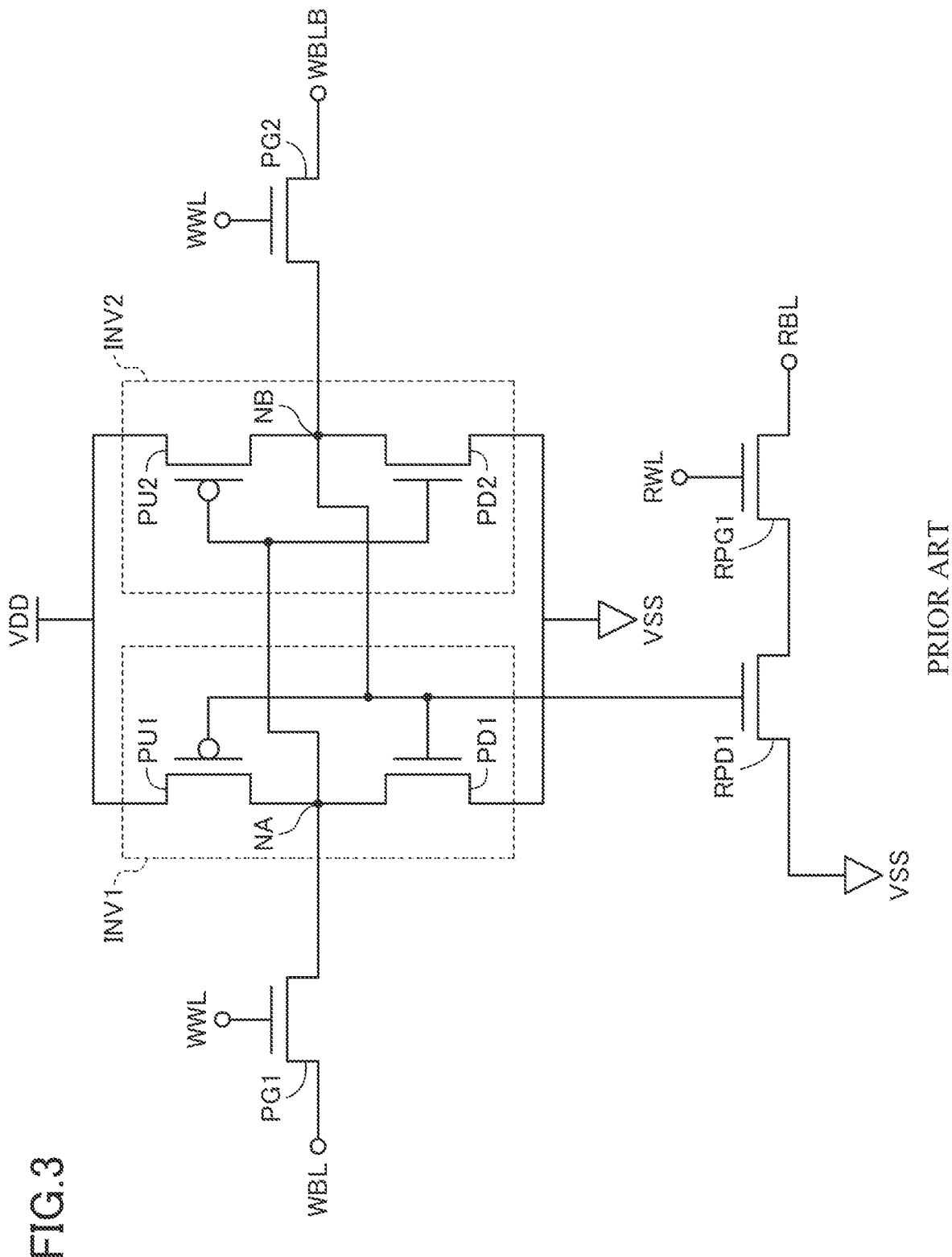
FIG. 3 is a circuit diagram showing a standard configuration of the 2-port SRAM cell related to the first embodiment.

FIG. 3 is a circuit diagram showing a configuration of the 2-port SRAM cell related to the first embodiment. In the 2-port SRAM cell, a 2-port SRAM circuit including load transistors PUT and PU2, drive transistors PD1 and PD2, access transistors PGT and PG2, a read drive transistor RPD1, and a read access transistor RPG1 is configured as illustrated in FIG. 3. The load transistors PUT and PU2 are each a P-type FET, and the drive transistors PD1 and PD2, the access transistors PGT and PG2, the read drive transistor RPD1, and the read access transistor RPG1 are each an N-type FET.

The load transistor PU1 is provided between a power source VDD and a first node NA, and the drive transistor PD1 is provided between the first node NA and a power source VSS. The load transistor PU1 and the drive transistor PD1 have their gates connected to a second node NB to configure an inverter INV1. The load transistor PU2 is provided between the power source VDD and the second node NB, and the drive transistor PD2 is provided between the second node NB and the power source VSS. The load transistor PU2 and the drive transistor PD2 have their gates connected to the first node NA to configure an inverter INV2. That is, an output of one of the inverters is connected to an input of the other inverter, thereby configuring a latch.

The access transistor PG1 is provided between a write-bit line WBL and the first node NA, and the gate thereof is connected to a write-word line WWL. The access transistor PG2 is provided between a write-bit line WBLB and the second node NB, and the gate thereof is connected to a write-word line WWL. The write-bit lines WBL and WBLB configure a complementary write-bit line pair.

The read drive transistor RPD1 has its source connected to the power source VSS, its gate to the second node NB, and the drain to the source of the read access transistor RPG1. The read access transistor RPG1 has its gate connected to a read-word line RWL and its drain to a read-bit line RBL.

In the 2-port SRAM circuit, while the write-bit lines WBL and WBLB constituting the complementary write-bit line pair are driven to a high level and a low level, respectively, driving the write-word line WWL to the high level causes the high level to be written to the first node NA and the low level to the second node NB. On the other hand, while the write-bit lines WBL and WBLB are driven to the low level and a high level, respectively, driving the write-word line WWL to the high level causes the low level to be written to the first node NA and the high level to the second node NB. Then, while data is written to the first and the second nodes NA and NB, driving the write-word line WWL to the low level determines a latch state and retains the data written to the first and the second nodes NA and NB.

Further, with the read-bit line RBL is pre-charged in advance to the high level, driving the read-word line RWL to the high level determines the state of the read-bit line RBL according to the data written to the second node NB, and data can be read out from the SRAM cell. Specifically, when the second node NB is at the high level, the read-bit line RBL is discharged to the low level. On the other hand, when the second node NB is at the low level, the read-bit line RBL maintains the high level.

As described above, the 2-port SRAM cell has a function of writing and retaining data to and in the SRAM cell, and reading out data from the SRAM cell by controlling the write-bit lines WBL and WBLB, the read-bit line RBL, the write-word line WWL, and the read-word line RWL.

It should be noted that in the following description, the lateral direction of the figure in the plan view of FIG. 1 or the like is the X direction, the longitudinal direction is Y direction, and a direction perpendicular to the substrate surface is the Z direction. Further, solid lines running longitudinally and laterally in the plan view of FIG. 1 and solid lines running longitudinally in the cross-sectional view of FIG. 2 and the like illustrate a grid used for arranging components at the time of designing. Cells of the grid are arranged at equal intervals in the X direction, and arranged at equal intervals in the Y direction. It should be noted that the intervals of the cells in the X direction and those in the Y direction may be the same or different. Further, the intervals of the cells may be different in each layer. Further, each part does not necessarily have to be arranged on the grid. However, for the sake of reducing manufacturing-attributed variations, the parts are arranged on the grid in one preferred embodiment.

Further, the dotted lines surrounding the cell in the plan view of FIG. 1 and the like indicate a cell frame of the 2-port SRAM cell (outer edge of the 2-port SRAM cell). The 2-port SRAM cell is arranged so that its cell frame contacts with a cell frame of an adjacent cell in the X direction or Y direction.

As shown in the illustration (a) of FIG. 1, the cell has, at its lower portion, power supply lines 11 and 12 extending in the Y direction. Both of the power supply lines 11 and 12 are each buried power rail (BPR) formed in a buried wiring layer. The power supply lines 11 and 12 supply the same power supply voltage VSS.

Nanowires 21a to 21l extending in the Y direction are formed in the lower portion of the cell, and nanowires 21m, 21n, 26a to 26h extending in the Y direction are formed in the upper portion of the cell.

Further, the nanowires 21a to 21f are formed so as to align in the X direction. The nanowires 21g to 21l are formed so as to align in the X direction. The nanowires 21m, 26a to 26d are formed so as to align in the X direction. The nanowires 21n, 26e to 26h are formed so as to align in the X direction.

Further, the nanowires 21a to 21f are formed so as to align with the nanowires 21g to 21l in the Y direction, respectively. The nanowires 26a to 26d are formed so as to align with the nanowires 26e to 26h in the Y direction, respectively.

The nanowires 21c and 21h overlap the nanowires 21m and 21n, respectively, in plan view. The nanowires 21a, 21d to 21g, and 21j to 21l overlap the nanowires 26a to 26h, respectively, in plan view.

Gate lines (Gate) 31 to 35 each extend in the Z direction from the lower portion to the upper portion of the cell, and extend in the X direction. The gate lines 31 and 32 are arranged side by side in the X direction, and the gate lines 33 to 35 are arranged side by side in the X direction. The gate line 31 serves as gates of the transistors N1 and N2, and a dummy transistor P21. The gate line 32 serves as gates of the transistors N3 to N6, and P1 and dummy transistors P22 to P24. The gate line 33 serves as gates of the transistors N7, N8, and P2 and a dummy transistor P25. The gate line 34 serves as gates of the transistors N9 and N10, and a dummy transistor P26. The gate line 35 serves as gates of the transistors N11 and N12, and dummy transistors P27 and P28.

Pads 22a to 22r doped to the N-type semiconductor are formed at the upper end of the nanowire 21a in the figure, between the nanowires 21a and 21g, at the lower end of the nanowire 21g in the figure, at the upper end of the nanowire 21b in the figure, between the nanowires 21b and 21h, at the lower end of the nanowire 21h in the figure, at the upper end of the nanowire 21c in the figure, between the nanowires 21c and 21i, at the lower end of the nanowire 21i in the figure, at the upper end of the nanowire 21d in the figure, between the nanowires 21d and 21j, at the lower end of the nanowire 21j in the figure, at the upper end of the nanowire 21e in the figure, between the nanowires 21e and 21k, at the lower end of the nanowire 21k in the figure, at the upper end of the nanowire 21f in the figure, between the nanowires 21f and 21l, and at the lower end of the nanowire 21l in the figure, respectively. The nanowires 21a to 21l constitute channel portions of the transistors N1 to N12, respectively. The pads 22a and 22b constitute anode of the transistor N1. The pads 22d and 22e constitute anode of the transistor N2. The pads 22g and 22h constitute a node of the transistor N3. The pads 22j and 22k constitute a node of the transistor N4. The pads 22m and 22n constitute a node of the transistor N5. The pads 22p and 22q constitute a node of the transistor N6. The pads 22b and 22c constitute a node of the transistor N7. The pads 22e and 22f constitute a node of the transistor N8. The pads 22h and 22i constitute a node of the transistor N9. The pads 22k and 22l constitute a node of the transistor N10. The pads 22n and 22o constitute a node of the transistor N11. The pads 22q and 22r constitute a node of the transistor N12.

That is, the nanowire 21a, the gate line 31, and the pads 22a and 22b constitute the transistor N1. The nanowire 21b, the gate line 31, and the pads 22d and 22e constitute the transistor N2. The nanowire 21c, the gate line 32, and the pads 22g and 22h constitute the transistor N3. The nanowire 21d, the gate line 32, and the pads 22j and 22k constitute the transistor N4. The nanowire 21e, the gate line 32, and the pads 22m and 22n constitute the transistor N5. The nanowire 21f, the gate line 32, and the pads 22p and 22q constitute the transistor N6. The nanowire 21g, the gate line 33, and the pads 22b and 22c constitute the transistor N7. The nanowire 21h, the gate line 33, and the pads 22e and 22f constitute the transistor N8. The nanowire 21i, the gate line 34, and the pads 22h and 22i constitute the transistor N9. The nanowire 21j, the gate line 34, and the pads 22k and 22l constitute the transistor N10. The nanowire 21k, the gate line 35, and the pads 22n and 22o constitute the transistor N11. The nanowire 21l, the gate line 35, and the pads 22q and 22r constitute the transistor N12.

Pads 22s to 22v doped to the P-type semiconductor are formed at the upper end of the nanowire 21m in the figure, at the lower end of the nanowire 21m in the figure, at the upper end of the nanowire 21n in the figure, and at the lower end of the nanowire 21n in the figure, respectively. The nanowires 21m and 21n constitute channel portions of the transistors P1 and P2, respectively. The pads 22s and 22t constitute a node of the transistor P1. The pads 22u and 22v constitute a node of the transistor P2.

That is, the nanowire 21m, the gate line 32, and the pads 22s and 22t constitute the transistor P1. The nanowire 21n, the gate line 33, and the pads 22u and 22v constitute the transistor P2. The transistors P1 and P2 correspond to the load transistors PU1 and PU2, respectively.

Dummy pads 27a to 27l doped to the P-type semiconductor are formed at the upper end of the nanowire 26a in the figure, between the nanowires 26a and 26e, at the lower end of the nanowire 26e in the figure, at the upper end of the nanowire 26b in the figure, between the nanowires 26b and 26f, at the lower end of the nanowire 26f in the figure, at the upper end of the nanowire 26c in the figure, between the nanowires 26c and 26g, at the lower end of the nanowire 26g in the figure, at the upper end of the nanowire 26d in the figure, between the nanowires 26d and 26h, and at the lower end of the nanowire 26h in the figure, respectively. The dummy pads 27a and 27b constitute a node of the dummy transistor P21. The dummy pads 27d and 27e constitute a node of the dummy transistor P22. The dummy pads 27g and 27h constitute a node of the dummy transistor P23. The dummy pads 27j and 27k constitute a node of the dummy transistor P24. The dummy pads 27b and 27c constitute a node of the dummy transistor P25. The dummy pads 27e and 27f constitute a node of the dummy transistor P26. The dummy pads 27h and 27i constitute a node of the dummy transistor P27. The dummy pads 27k and 27l constitute a node of the dummy transistor P28.

That is, the nanowire 26a, the gate line 31, and the dummy pads 27a and 27b constitute the dummy transistor P21. The nanowire 26b, the gate line 32, and the dummy pads 27d and 27e constitute the dummy transistor P22. The nanowire 26c, the gate line 32, and the dummy pads 27g and 27h constitute the dummy transistor P23. The nanowire 26d, the gate line 32, and the dummy pads 27j and 27k constitute the dummy transistor P24. The nanowire 26e, the gate line 33, and the dummy pads 27b and 27c constitute the dummy transistor P25. The nanowire 26f, the gate line 34, and the dummy pads 27e and 27f constitute the dummy transistor P26. The nanowire 26g, the gate line 35, and the dummy pads 27h and 27i constitute the dummy transistor P27. The nanowire 26h, the gate line 35, and the dummy pads 27k and 27l constitute the dummy transistor P28. The nanowires 26a to 26h correspond to the channel portions of the dummy transistors P21 to P28, respectively. The dummy transistors P21 to P28 are transistors having no logic function. Further, the dummy transistors P21 to P28 are omitted in the circuit diagram of FIG. 3. Note that, some of the embodiments and variation thereof described below include dummy transistors in the 2-port SRAM cells; however, illustrations of the dummy transistors in the figure are omitted, as each dummy transistor has no effect on the logic function of the 2-port SRAM cells.

Therefore, transistors N1, N3 to N8, N10 to N12 overlap the dummy transistor P21, the transistor P1, the dummy transistors P22 to P25, the transistor P2, and the dummy transistors P26 to P28, respectively, in plan view.

Further, the transistors N1 to N6 are formed so as to align in the X direction. The transistors N7 to N12 are formed so as to align in the X direction. The transistor P1 and the dummy transistors P21 to P24 are formed so as to align in the X direction. The transistor P2 and the dummy transistors P25 to P28 are formed so as to align in the X direction.

Further, the transistors N1 to N6 are formed so as to align with the transistors N7 to N12 in the Y direction, respectively. The dummy transistors P21 to P24 are formed so as to align with the dummy transistors P25 to P28 in the Y direction, respectively.

As shown in the illustration (a) of FIG. 1, local interconnects 41a to 41h extended in the X direction are formed in the lower portion of the cell. The local interconnect 41a is connected to the pads 22a and 22d. The local interconnect 41b is connected to the pads 22b and 22e. The local interconnect 41c is connected to the pads 22c and 22f. The local interconnect 41d is connected to the pads 22g, 22j, 22m, and 22p. The local interconnect 41e is connected to the pads 22h and 22k. The local interconnect 41f is connected to the pads 22i and 22l. The local interconnect 41g is connected to the pads 22n and 22q. The local interconnect 41h is connected to the pads 22o and 22r.

That is, the transistors N1 and N2 have their pads connected to each other via a local interconnect, and share a gate line. The transistors N3 and N4 have their pads connected to each other via a local interconnect, and share a gate line. The transistors N5 and N6 have their pads connected to each other via a local interconnect, and share a gate line. The transistors N7 and N8 have their pads connected to each other via a local interconnect, and share a gate line. The transistors N9 and N10 have their pads connected to each other via a local interconnect, and share a gate line. The transistors N11 and N12 have their pads connected to each other via a local interconnect, and share a gate line. Note that the transistors N1 and N2 correspond to the access transistor PG2, the transistors N3 and N4 correspond to the drive transistor PD1, the transistors N5 and N6 correspond to the read drive transistor RPD1, the transistors N7 and N8 correspond to the drive transistor PD2, the transistors N9 and N10 correspond to the access transistor PG1, and the transistors N11 and N12 correspond to the read access transistor RPG1. Therefore, in the 2-port SRAM cell related to the present embodiment, the drive transistors PD1 and PD2, the access transistors PG1 and PG2, the read drive transistor RPD1, and the read access transistor RPG1 are each configured by two N-type FETs connected in parallel.

As shown in the illustration (b) of FIG. 1, local interconnects 41i to 41l extended in the X direction are formed in the upper portion of the cell. The local interconnect 41i is connected to the pad 22s. The local interconnect 41j is connected to the pad 22t. The local interconnect 41k is connected to the pad 22u. The local interconnect 41l is connected to the pad 22v.

The local interconnect 41b is connected to the local interconnect 41k through a contact (via) 51a. The local interconnect 41c is connected to the power supply line 11 through a contact 51b. The local interconnect 41d is connected to the power supply line 12 through a contact 51c. The local interconnect 41e is connected to the local interconnect 41j through a contact 51d.

The local interconnect 41j is connected to the gate line 33 through a shared-contact 61a. The local interconnect 41k is connected to the gate line 32 through a shared-contact 61b. Note that the local interconnects 41e and 41j, the contact 51d, the shared-contact 61a and the gate line 33 correspond to the first node NA, and the local interconnects 41b and 41k, the contact 51a, the shared-contact 61b and the gate line 32 correspond to the second node NB.

As shown in the illustration (c) of FIG. 1, lines 71 to 74 extended in the Y direction from the upper end to the lower end of the cell are formed in the M1 wiring layer that is a metal wiring layer. Further, lines 75 to 77 are formed. The line 71 supplies the voltage VDD. The lines 72 to 74 correspond to the write-bit lines WBL and WBLB and the read-bit line RBL, respectively.

Lines 81 and 82 extended in the X direction from the left end to the right end of the cell are formed in the M2 wiring layer that is a layer above the M1 wiring layer. The lines 81 and 82 are aligned in the Y direction. The line 81 corresponds to the write-word line WWL, and the line 82 corresponds to the read-word line RWL.

The line 71 is connected to the local interconnect 41i through a contact 91a, and connected to the local interconnect 41l through a contact 91b. The line 72 is connected to the local interconnect 41f through a contact 91c. The line 73 is connected to the local interconnect 41a through a contact 91d. The line 74 is connected to the local interconnect 41h through a contact 91e. The line 75 is connected to the gate line 31 through a contact (gate-contact) 61a, and connected to the line 81 through a contact 91f. The line 76 is connected to the gate line 34 through a contact 61d, and connected to the line 81 through a contact 91g. The line 77 is connected to the gate line 35 through a contact 61e, and connected to the line 82 through a contact 91h. That is, the line 81 is connected to the gate line 31 through the contact 91f, the line 75, and the contact 61c, and connected to the gate line 34 through the contact 91g, the line 76, and the contact 61d. The line 82 is connected to the gate line 35 through the contact 91h, the line 77, and the contact 61e.

With the above configuration, in the transistor P1 (load transistor PU1), the pad 22s is connected to the line 71 that supplies the voltage VDD, the pad 22t is connected to the local interconnect 41j (first node NA), and the gate line 32 is connected to the shared-contact 61b (second node NB). In the transistor P2 (load transistor PU2), the pad 22v is connected to the line 71 that supplies the voltage VDD, the pad 22u is connected to the local interconnect 41k (second node NB), and the gate line 33 is connected to the shared-contact 61a (first node NA). In the transistors N3 and N4 (drive transistor PD1), the pads 22h and 22k are connected to the local interconnect 41e (first node NA), the pads 22g and 22j are connected to the power supply line 12 that supplies the voltage VSS, and the gate line 32 is connected to the shared-contact 61b (second node NB). In the transistors N7 and N8 (drive transistor PD2), the pads 22b and 22e are connected to the local interconnect 41b (second node NB), the pads 22c and 22f are connected to the power supply line 11 that supplies the voltage VSS, and the gate line 33 is connected to the shared-contact 61a (first node NA). In the transistors N9 and N10 (access transistor PG1), the pads 22i and 22l are connected to the line 72 (write-bit line WBL), the pads 22h and 22k are connected to the local interconnect 41e (first node NA), and the gate line 34 is connected to the line 81 (write-word line WWL). In the transistors N1 and N2 (access transistor PG2), the pads 22a and 22d are connected to the line 73 (write-bit line WBLB), the pads 22b and 22e are connected to the local interconnect 41b (second node NB), and the gate line 31 is connected to the line 81 (write-word line WWL). In the transistors N5 and N6 (read drive transistor RPD1), the pads 22m and 22p are connected to the power supply line 12 that supplies the voltage VSS, and the gate line 32 is connected to the shared-contact 61b (second node NB). The transistors N11 and N12 (read access transistor RPG1) share the pads 22n and 22q with the transistors N5 and N6; the pads 22o and 22r are connected to the line 74 (read-bit line RBL); and the gate line 35 is connected to the line 82 (read-word line RWL). That is, the transistors N1 to N12, P1, and P2 form a 2-port SRAM circuit. Further, the transistors N1 to N12 are formed in the lower portion of the cell, and transistors P1 and P2 are formed in the upper portion of the cell. Each of the transistors N1 to N12, P1, and P2 is a three-dimensional transistor. Thus, a 2-port SRAM cell using a CFET can be achieved.

The transistors P1 and P2 overlap the transistors N3 and N8, respectively, in plan view. That is, the transistors P1 and P2 are stacked on the transistors N3 and N8, respectively. Further, the transistors N5 and N6 are formed so as to align with the transistors N11 and N12 in the Y direction, respectively. This way, the area of the 2-port SRAM cell can be reduced.

Thus, a 2-port SRAM cell using a CFET can be achieved, and the area of the 2-port SRAM cell can be reduced.

Further, the transistors N1 to N12 are formed in the lower portion of the cell, and transistors P1 and P2 and the dummy transistors P21 to P26 are formed in the upper portion of the cell. That is, only the N-type FETs are formed in the lower portion of the cell, and only the P-type FETs including the dummy transistors are formed in the upper portion of the cell. This keeps the manufacturing process from being complicated.

Note that, in a case where the 2-port SRAM cells are arranged adjacent to each other in the X direction, the 2-port SRAM cells are arranged so as to be inverted in the X direction. Further, in a case where the 2-port SRAM cells are arranged adjacent to each other in the Y direction, the 2-port SRAM cells are arranged so as to be inverted in the Y direction.

Further, none of the nodes of the dummy transistors P21 to P28 are connected to the local interconnects. Therefore, the dummy transistors P21 to P28 do not affect the logic function of the 2-port SRAM cells. Further, the dummy transistors P21 to P28 do not have to be formed in the 2-port SRAM cell of the present embodiment. However, by forming the dummy transistors P21 to P28, it is possible to suppress manufacturing-attributed variations of the semiconductor memory devices, and improve the yield and the reliability of the semiconductor memory devices.

Further, the shared-contact 61a connecting the local interconnect 41j to the gate line 33 and the shared-contact 61b connecting the local interconnect 41k to the gate line 32 may be formed in the same process as the process of forming the contacts 61c to 61e connecting the lines arranged in the M1 wiring layer to the gate lines, or may be formed in a different process.

Further, although the line 71 that supplies the voltage VDD is provided in the M1 wiring layer, the line 71 may be provided in the buried wiring layer. Further, the line 71 may be provided in both the M1 wiring layer and the buried wiring layer. In this case, since the power source that supplies the voltage VDD is strengthened, the power source can be stabilized.

(Variation 1)

Figure 4:
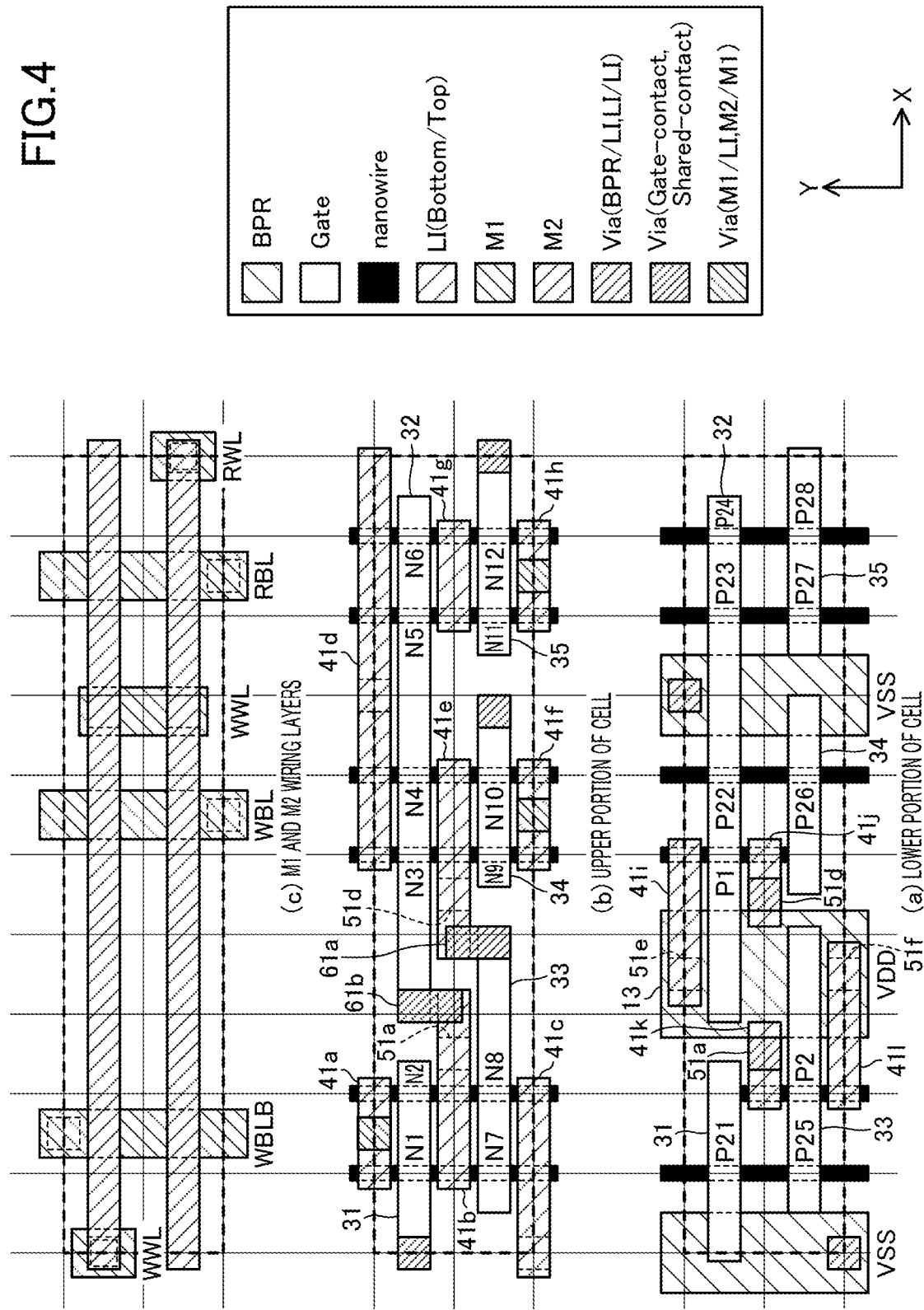
FIG. 4 is a plan view showing another exemplary layout configuration of the 2-port SRAM cell related to the first embodiment.

FIG. 4 is a plan view showing another exemplary layout configuration of the 2-port SRAM cell related to the first embodiment. Specifically, an illustration (a) of FIG. 4 shows a lower part of the cell, an illustration (b) of FIG. 4 shows an upper part of the cell, and an illustration (c) of FIG. 4 shows M1 and M2 wiring layers. In FIG. 4, N-type FETs are formed in the upper portion of the cell, and P-type FETs are formed in the lower portion of the cell. That is, in this variation, the conductive types of the transistors formed in the upper portion and the lower portion of the cell are reversed from those of the 2-port SRAM related to the first embodiment.

Specifically, transistors N1 to N12 and local interconnects 41a to 41h are formed in the upper portion of the cell, and transistors P1 and P2, and dummy transistors P21 to P28 and local interconnects 41i to 41l are formed in the lower portion of the cell.

Further, a power supply line 13 is formed in the buried wiring layer. The power supply line 13 supplies the voltage VDD.

The local interconnect 41i is connected to the power supply line 13 through a contact 51e, and the local interconnect 41l is connected to the power supply line 13 through a contact 51f.

The local interconnect 41k is connected to a gate line 32 through a contact 51a, the local interconnect 41b, and a shared-contact 61b. The local interconnect 41j is connected to a gate line 33 through a contact 51d, the local interconnect 41e, and a shared-contact 61a.

This variation brings about effects similar to those of the 2-port SRAM cell related to the first embodiment.

(Variation 2)

Figure 5:
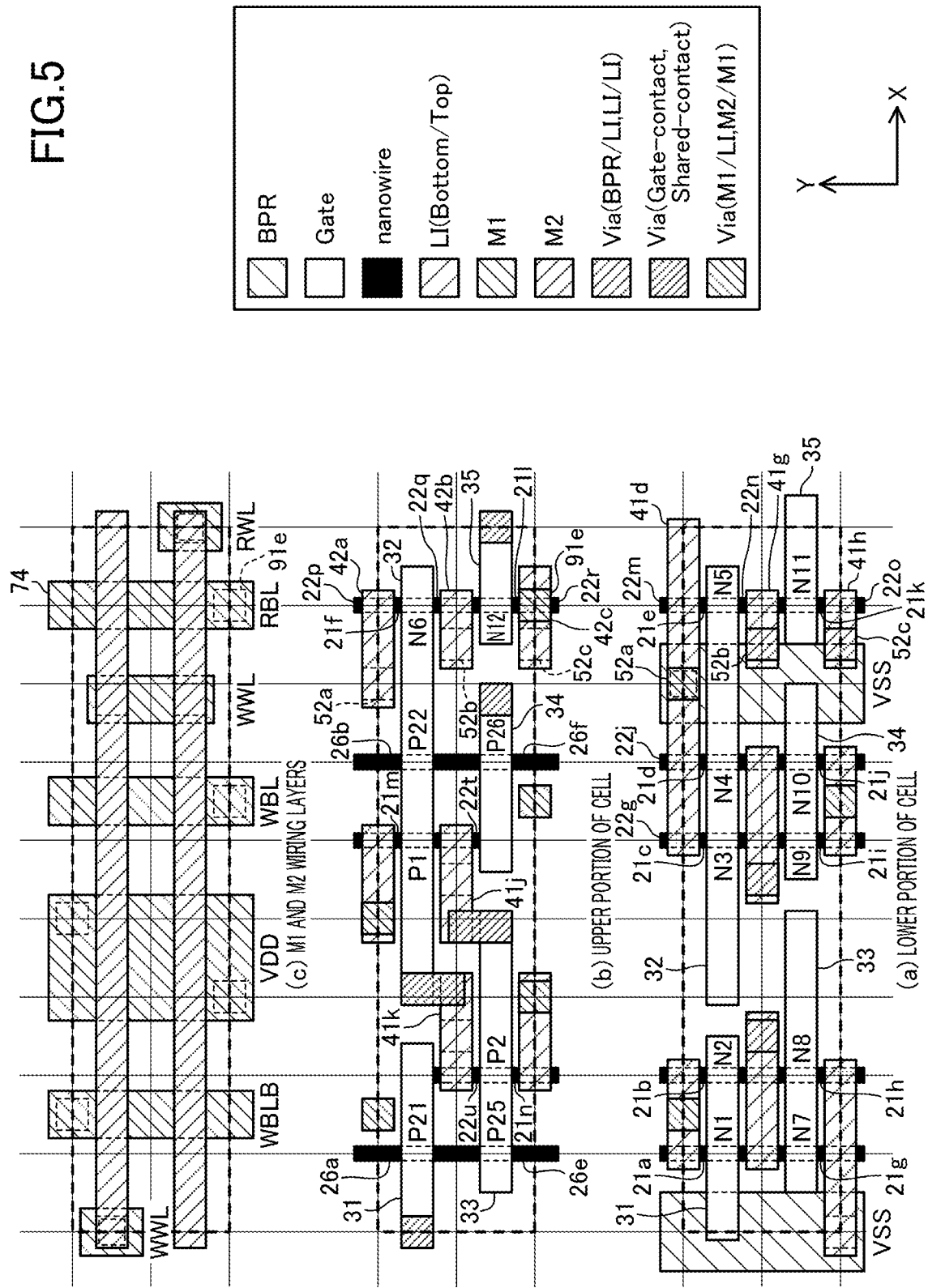
FIG. 5 is a plan view showing another exemplary layout configuration of the 2-port SRAM cell related to the first embodiment.

FIG. 5 is a plan view showing another exemplary layout configuration of the 2-port SRAM cell related to the first embodiment. Specifically, an illustration (a) of FIG. 5 shows a lower part of the cell, an illustration (b) of FIG. 5 shows an upper part of the cell, and an illustration (c) of FIG. 5 shows M1 and M2 wiring layers. In FIG. 5, transistors N6 and N12 are formed in the upper portion of the cell. The dummy transistors P23, P24, P27 and P28 are not formed.

Specifically, nanowires 21f and 21l are formed in the upper part of the cell.

The nanowire 21f is formed so as to align with nanowires 21m, 26a, 26b in the X direction, and the nanowire 21l is formed so as to align with nanowires 21n, 26e, 26f in the X direction. That is, the transistor N6 is formed so as to align with a transistor P1 and dummy transistors P21 and P22 in the X direction, and the transistor N12 is formed so as to align with a transistor P2 and the dummy transistors P25 and P26 in the X direction.

The nanowires 21f and 21l overlap nanowires 21e and 21k, respectively, in plan view. That is, the transistors N6 and N12 overlap transistors N5 and N11, respectively, in plan view.

Local interconnects 42a to 42c extending in the X direction are formed in the upper portion of the cell. The local interconnect 42a is connected to pad 22p. The local interconnect 42b is connected to a pad 22q. The local interconnect 42c is connected to a pad 22r.

A local interconnect 41*d* is connected to pads 22*g*, 22*j*, and 22*m* in the lower portion of the cell. A local interconnect 41*g* is connected to a pad 22*n*. A local interconnect 41*h* is connected to a pad 22*o*.

The local interconnect 42*a* is connected to the local interconnect 41*d* through a contact 52*a*. The local interconnect 42*b* is connected to the local interconnect 41*g* through a contact 52*b*. The local interconnect 42*c* is connected to the local interconnect 41*h* through a contact 52*c*, and connected to a line 74 through a contact 91*e*.

In this variation, the transistor corresponding to the read drive transistor RPD1 and the transistor corresponding to the read access transistor RPG1 are stacked. This variation brings about effects similar to those of the 2-port SRAM cell related to the first embodiment.

Further, the transistors N6 and N12 overlap the transistors N5 and N11, respectively, in plan view. That is, the transistors N6 and N12 are stacked on the transistors N5 and N11, respectively. This way, the area of the 2-port SRAM cell can be reduced.

Further, the transistors N1 to N5 and N7 to N11 are formed in the lower portion of the cell, and the transistors N6, N12, P1, and P2 and the dummy transistors P21, P22, P25, and P26 are formed in the upper portion of the cell. That is, the above configuration can be achieved by forming only the N-type FETs in the lower portion of the cell, and partially replacing the transistors formed in the upper portion of the cell with the N-type FET. This keeps the manufacturing process from being complicated.

(Variation 3)

Figure 6:
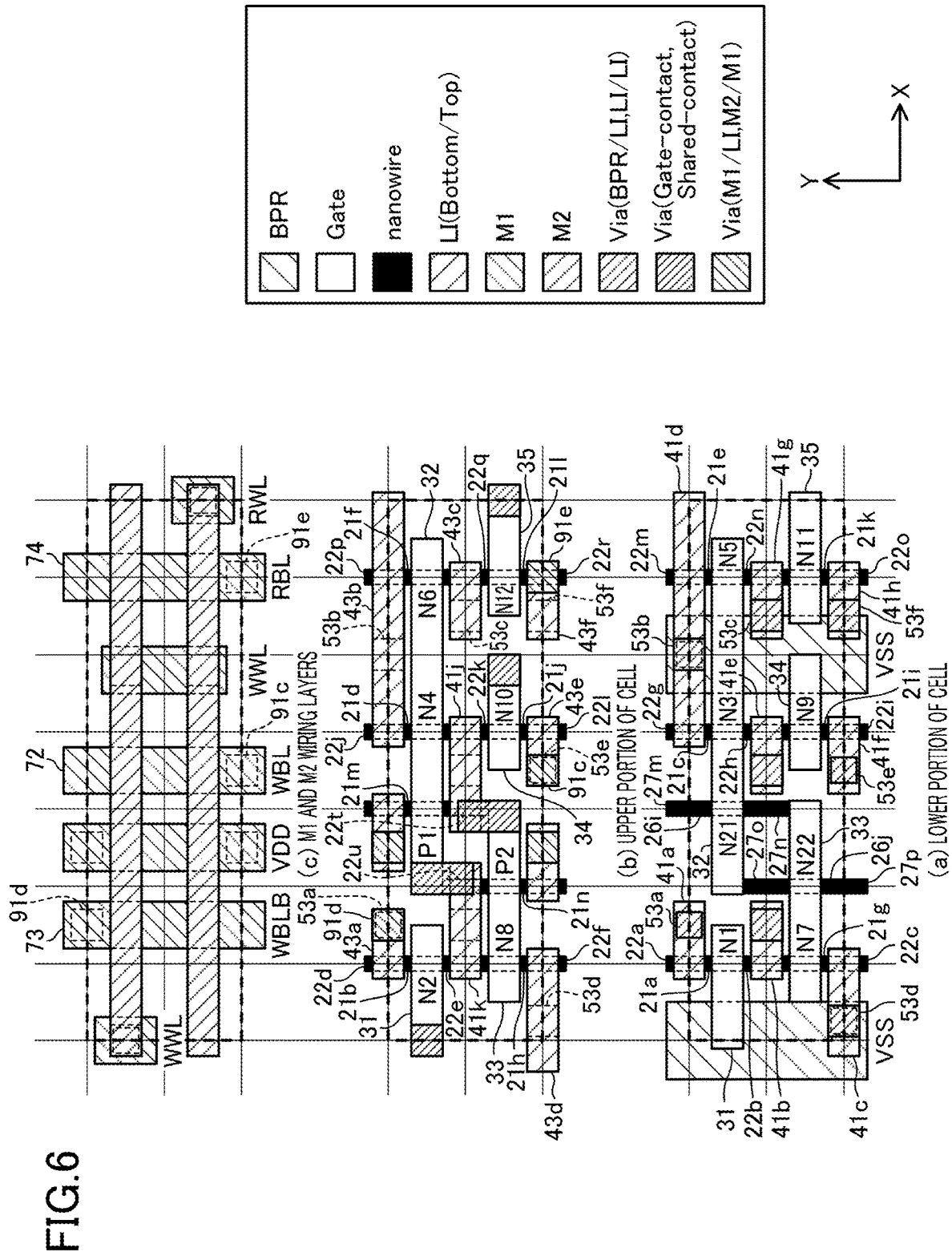
FIG. 6 is a plan view showing another exemplary layout configuration of the 2-port SRAM cell related to the first embodiment.

FIG. 6 is a plan view showing another exemplary layout configuration of the 2-port SRAM cell related to the first embodiment. Specifically, an illustration (a) of FIG. 6 shows a lower part of the cell, an illustration (b) of FIG. 6 shows an upper part of the cell, and an illustration (c) of FIG. 6 shows M1 and M2 wiring layers. In FIG. 6, transistors N2, N4, N6, N8, N10, and N12 are formed in the upper portion of the cell. The dummy transistors P21 to P28 are not formed.

Specifically, nanowires 21*b*, 21*d*, 21*f*, 21*h*, 21*j*, and 21*l* are formed in the upper portion of the cell.

The nanowires 21*b*, 21*d*, 21*f* are formed so as to align with a nanowire 21*m* in the X direction. The nanowires 21*h*, 21*j*, 21*l* are formed so as to align with a nanowire 21*n* in the X direction. That is, the transistors N2, N4, N6 are formed so as to align with a transistor P1 in the X direction. The transistors N8, N10, N12 are formed so as to align with a transistor P2 in the X direction.

Further, the nanowires 21*b*, 21*d*, 21*f*, 21*h*, 21*j*, and 21*l* overlap nanowires 21*a*, 21*c*, 21*e*, 21*g*, 21*i*, and 21*k*, respectively, in plan view. That is, the transistors N2, N4, N6, N8, N10, and N12 overlap transistors N1, N3, N5, N7, N9, and N11, respectively, in plan view.

In the lower portion of the cell, nanowires 26*i* and 26*j* extending in the Y direction are formed. A gate line 32 serves as the gate of a dummy transistor N21, and a gate line 33 serves as the gate of a dummy transistor N22. Dummy pads 27*m* to 27*p* doped to the N-type semiconductor are formed at the upper end of the nanowire 26*i* in the figure, at the lower end of the nanowire 26*i* in the figure, at the upper end of the nanowire 26*j* in the figure, and at the lower end of the nanowire 26*j* in the figure, respectively. The nanowires 26*i* and 26*j* constitute channel portions of the dummy transistors N21 and N22, respectively. The dummy pads 27*m* and 27*n* constitute a node of the dummy transistor N21, and the dummy pads 27*o* and 27*p* constitute a node of the dummy transistor N22. That is, the nanowire 26*i*, the gate line 32, and the dummy pads 27*m* and 27*n* constitute the dummy transistor N21. The nanowire 26*j*, the gate line 33, and the dummy pads 27*o* and 27*p* constitute the dummy transistor N22. The dummy transistors N21 and N22 are transistors having no logic function.

Here, the nanowires 21*m* and 21*n* overlap the nanowires 26*i* and 26*j*, respectively, in plan view. That is, the transistors P1 and P2 overlap the dummy transistors N21 and N22, respectively, in plan view.

As shown in the illustration (b) of FIG. 6, local interconnects 43*a* to 43*f* extended in the X direction are formed in the upper portion of the cell. The local interconnect 43*a* is connected to a pad 22*d*. The local interconnect 43*b* is connected to pads 22*j* and 22*p*. The local interconnect 43*c* is connected to a pad 22*q*. The local interconnect 43*d* is connected to a pad 22*f*. The local interconnect 43*e* is connected to a pad 22*l*. The local interconnect 43*f* is connected to a pad 22*r*. The local interconnect 41*j* is connected to pads 22*k* and 22*t* in the upper portion of the cell. The local interconnect 41*k* is connected to pads 22*e* and 22*u*.

As shown in the illustration (a) of FIG. 6, a local interconnect 41*a* is connected to a pad 22*a* in the lower portion of the cell. A local interconnect 41*b* is connected to a pad 22*b*. A local interconnect 41*c* is connected to a pad 22*c*. A local interconnect 41*d* is connected to pads 22*g* and 22*m*. A local interconnect 41*e* is connected to a pad 22*h*. A local interconnect 41*f* is connected to a pad 22*i*. A local interconnect 41*g* is connected to a pad 22*n*. A local interconnect 41*h* is connected to a pad 22*o*.

The local interconnect 43*a* is connected to the local interconnect 41*a* through a contact 53*a*, and connected to a line 73 through a contact 91*d*. The local interconnect 43*b* is connected to the local interconnect 41*d* through a contact 53*b*. The local interconnect 43*c* is connected to the local interconnect 41*g* through a contact 53*c*. The local interconnect 43*d* is connected to the local interconnect 41*c* through a contact 53*d*. The local interconnect 43*e* is connected to the local interconnect 41*f* through a contact 53*e*, and connected to a line 72 through a contact 91*c*. The local interconnect 43*f* is connected to the local interconnect 41*h* through a contact 53*f*, and connected to a line 74 through a contact 91*e*.

In this variation, transistors corresponding to the drive transistor PD1, transistors corresponding to the drive transistor PD2, transistors corresponding to the access transistor PG1, transistors corresponding to the access transistor PG2, transistors corresponding to the read drive transistor RPD1, and transistors corresponding to the read access transistor RPG1 are stacked. This variation brings about effects similar to those of the 2-port SRAM cell related to the first embodiment.

Further, the transistors N2, N4, N6, N8, N10, and N12 overlap the transistors N1, N3, N5, N7, N9, and N11, respectively, in plan view. That is, the transistors N2, N4, N6, N8, N10, and N12 are stacked on the transistors N1, N3, N5, N7, N9, and N11, respectively. This way, the area of the 2-port SRAM cell can be reduced. Since each transistor is stacked with another transistor, there is no need for, for example, partially removing the transistors. This keeps the manufacturing process from being complicated.

Further, the transistors N1, N3, N5, N7, N9, and N11 and the dummy transistors N21 and N22 are formed in the lower portion of the cell, and transistors N2, N4, N6, N8, N10, N12, P1, and P2 are formed in the upper portion of the cell. That is, the above configuration can be achieved by forming only the N-type FETs in the lower portion of the cell, and partially replacing the transistors formed in the upper portion of the cell with the N-type FET. This keeps the manufacturing process from being complicated.

Second Embodiment

Figure 7:
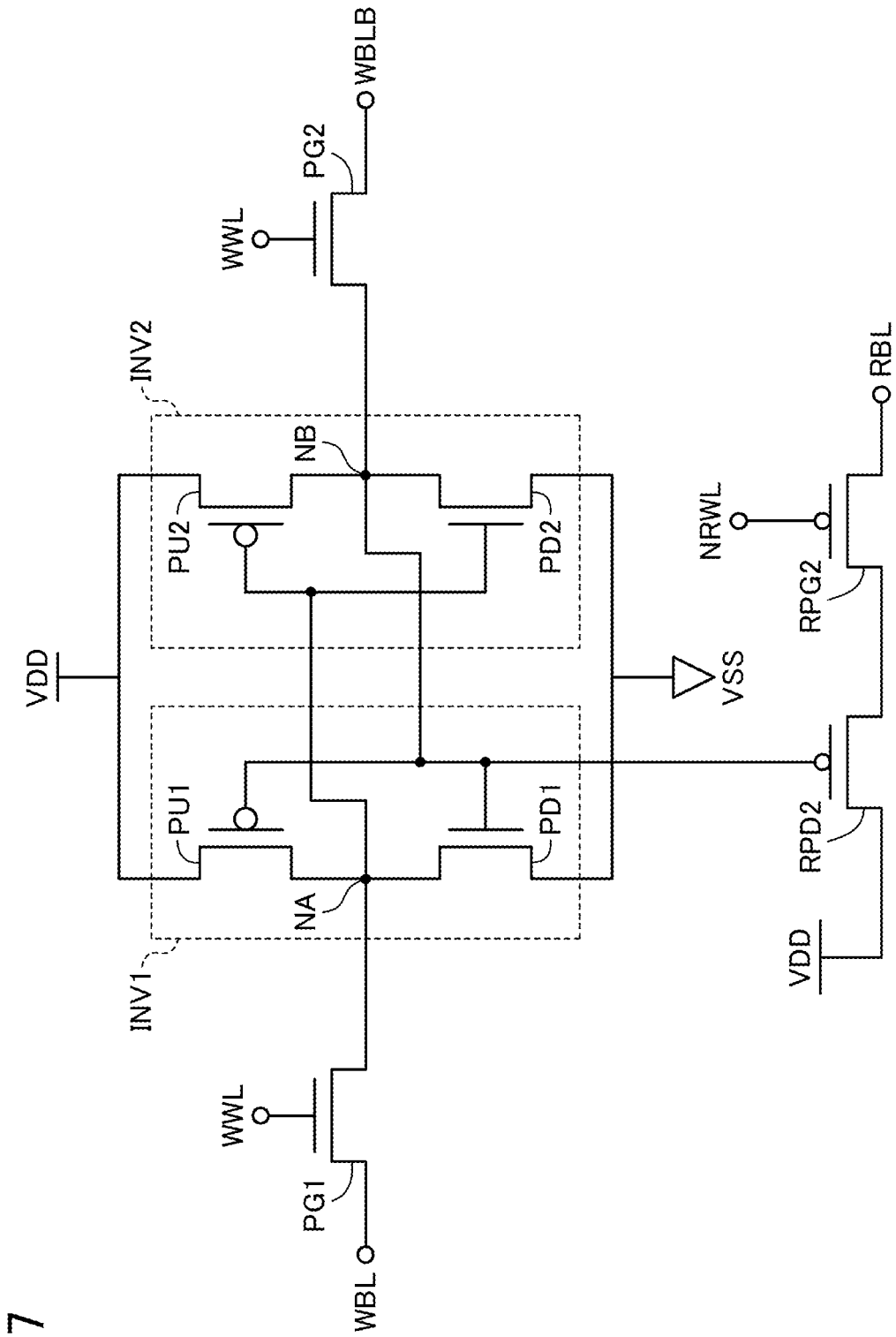
FIG. 7 is a circuit diagram showing a configuration of a 2-port SRAM cell related to a second embodiment.

FIG. 7 is a circuit diagram showing a configuration of the 2-port SRAM cell related to a second embodiment. In the 2-port SRAM cell related to the second embodiment, a 2-port SRAM circuit including load transistors PU1 and PU2, drive transistors PD1 and PD2, access transistors PG1 and PG2, a read drive transistor RPD2, and a read access transistor RPG2 is configured as illustrated in FIG. 7. The read drive transistor RPD2 and the read access transistor RPG2 are each a P-type FET.

The read drive transistor RPD2 has its source connected to the power source VDD, its gate to the second node NB, and the drain to the source of the read access transistor RPG2. The read access transistor RPG2 has its gate connected to a read-word line NRWL and its drain to a read-bit line RBL.

In the 2-port SRAM circuit, while the read-bit line RBL is discharged in advance to the low level, driving the read-word line NRWL to the low level determines the state of the read-bit line RBL according to the data written to the second node NB, and data can be read out from the SRAM cell. Specifically, when the second node NB is at the low level, the read-bit line RBL is charged to the high level. On the other hand, when the second node NB is at the high level, the read-bit line RBL maintains the low level.

Figure 8:
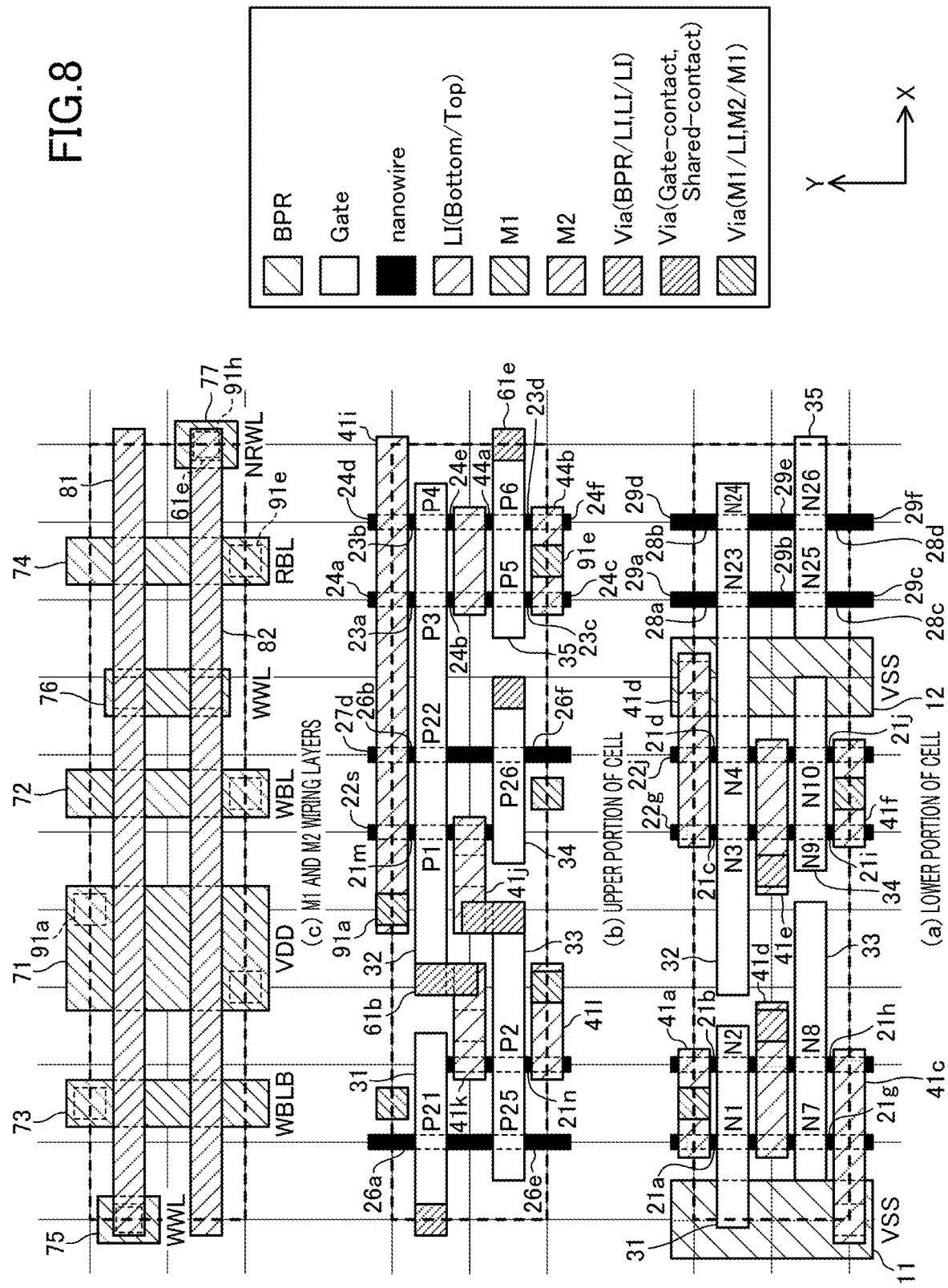
FIG. 8 is a plan view showing an exemplary layout configuration of the 2-port SRAM cell related to the second embodiment.

FIG. 8 is a plan view showing another exemplary layout configuration of the 2-port SRAM cell related to the second embodiment. Specifically, an illustration (a) of FIG. 8 shows a lower portion of the cell, an illustration (b) of FIG. 8 shows an upper portion of the cell, and an illustration (c) of FIG. 8 shows M1 and M2 wiring layers. In the 2-port SRAM cell related to the second embodiment, transistors P1 to P6 and dummy transistors P21, P22, P25, P26 are formed in the upper portion of the cell, and transistors N1 to N4, and N7 to N10 and dummy transistors N23 to N26 are formed in the lower portion of the cell. Note that a line 82 corresponds to the read-word line NRWL in FIG. 8.

As shown in the illustrations (a) and (b) of FIG. 8, nanowires 23a to 23d extending in the Y direction are formed in the upper portion of the cell, and nanowires 28a to 28d extending in the Y direction are formed in the lower portion of the cell.

Further, the nanowires 23a and 23b are formed so as to align with the nanowires 21m, 26a, and 26b in the X direction. The nanowires 23c and 23d are formed so as to align with the nanowires 21n, 26e, and 26f in the X direction. The nanowires 28a and 28b are formed so as to align with the nanowires 21a and 21d in the X direction. The nanowires 28c and 28d are formed so as to align with the nanowires 21g to 21j in the X direction.

Further, the nanowires 23a and 23b are formed so as to align with the nanowires 23c and 23d in the Y direction, respectively. The nanowires 28a and 28b are formed so as to align with the nanowires 28c and 28d in the Y direction, respectively.

The gate line 32 serves as the gates of the transistors P3 and P4 and the dummy transistors N23 and N24, and the gate line 35 serves as the gates of the transistors P5 and P6 and the dummy transistors N25 and N26.

Pads 24a to 24f doped to the P-type semiconductor are formed at the upper end of the nanowire 23a in the figure, between the nanowires 23a and 23c, at the lower end of the nanowire 23c in the figure, at the upper end of the nanowire 23b in the figure, between the nanowires 23b and 23d, and at the lower end of the nanowire 23d in the figure, respectively. The nanowires 23a to 23d constitute channel portions of the transistors P3 to P6, respectively. The pads 24a and 24b constitute a node of the transistor P3. The pads 24d and 24e constitute a node of the transistor P4. The pads 24b and 24c constitute a node of the transistor P5. The pads 24e and 24f constitute a node of the transistor P6.

That is, the nanowire 23a, the gate line 32, and the pads 24a and 24b constitute the transistor P3. The nanowire 23b, the gate line 32, and the pads 24d and 24e constitute the transistor P4. The nanowire 23c, the gate line 35, and the pads 24b and 24c constitute the transistor P5. The nanowire 23d, the gate line 35, and the pads 24e and 24f constitute the transistor P6.

Dummy pads 29a to 29f doped to the N-type semiconductor are formed at the upper end of the nanowire 28a in the figure, between the nanowires 28a and 28c, at the lower end of the nanowire 28c in the figure, at the upper end of the nanowire 28b in the figure, between the nanowires 28b and 28d, and at the lower end of the nanowire 28d in the figure, respectively. The nanowires 28a to 28d constitute channel portions of the dummy transistors N23 to N26, respectively. The dummy pads 29a and 29b constitute a node of the dummy transistor N23. The dummy pads 29d and 29e constitute a node of the dummy transistor N24. The dummy pads 29b and 29c constitute anode of the dummy transistor N25. The dummy pads 29e and 29f constitute a node of the dummy transistor N26.

That is, the nanowire 28a, the gate line 32, and the dummy pads 29a and 29b constitute the dummy transistor N23. The nanowire 28b, the gate line 32, and the dummy pads 29d and 29e constitute the dummy transistor N24. The nanowire 28c, the gate line 35, and the dummy pads 29b and 29c constitute the dummy transistor N25. The nanowire 28d, the gate line 35, and the dummy pads 29e and 29f constitute the dummy transistor N26. The dummy transistors N23 to N26 are transistors having no logic function.

Thus, in the 2-port SRAM cell related to the present embodiment, the transistors P3 to P6 overlap the dummy transistors N23 to N26, respectively, in plan view.

Local interconnects 44a and 44b extending in the X direction are formed in the upper portion of the cell. The local interconnect 44a is connected to the pads 24b and 24e. The local interconnect 44b is connected to the pads 24c and 24f. The local interconnect 41i is connected to the pads 22s, 24a, 24d and the dummy pad 27d. In the lower portion of the cell, the local interconnect 41d is connected to the pads 22g and 22j. That is, the transistors P3 and P4 have their pads connected to each other via a local interconnect, and share a gate line. The transistors P5 and P6 have their pads connected to each other via a local interconnect, and share a gate line. Note that the transistors P3 and P4 correspond to the read drive transistor RPD2, and the transistors P5 and P6 correspond to the read access transistor RPG2. Therefore, in the 2-port SRAM cell related to the present embodiment, the read drive transistor RPD2 and the read access transistor RPG2 are each configured by two P-type FETs connected in parallel.

Further, the local interconnect 41i is connected to the line 71 through a contact 91a, and the local interconnect 44b is connected to the line 74 through a contact 91e. Further, the line 82 is connected to the gate line 35 through the contact 91h, the line 77, and the contact 61e.

With the above configuration, in the transistors P3 and P4 (read drive transistor RPD2), the pads 24a and 24d are connected to the line 71 that supplies the voltage VDD, and the gate line 32 is connected to the second node NB through the shared-contact 61b. The transistors P5 and P6 (read access transistor RPG2) share the pads 24b and 24e with the transistors P3 and P4. The pads 24c and 24f are connected to the line 74 (read-bit line RBL), and the gate line 35 is connected to the line 82 (read-word line NRWL). That is, the transistors N1 to N4, N7 to N10, and P1 to P6 form a 2-port SRAM circuit. Further, the transistors N1 to N4, and N7 to N10 are formed in the lower portion of the cell, and transistors P1 to P6 are formed in the upper portion of the cell. Each of the transistors N1 to N4, N7 to N10, and P1 to P6 is a three-dimensional transistor. Thus, a 2-port SRAM cell using a CFET can be achieved.

The transistors P1 and P2 overlap the transistors N3 and N8, respectively, in plan view. That is, the transistors P1 and P2 are stacked on the transistors N3 and N8, respectively. Further, the transistors P3 and P4 are formed so as to align with the transistors P5 and P6 in the Y direction, respectively. This way, the area of the 2-port SRAM cell can be reduced.

Thus, a 2-port SRAM cell using a CFET can be achieved, and the area of the 2-port SRAM cell can be reduced.

Further, the transistors N1 to N4 and N7 to N10 and the dummy transistors N23 to N26 are formed in the lower portion of the cell, and the transistors P1 to P6 and the dummy transistors P21, P22, P25, and P26 are formed in the upper portion of the cell. That is, only the N-type FETs including the dummy transistors are formed in the lower portion of the cell, and only the P-type FETs including the dummy transistors are formed in the upper portion of the cell. This keeps the manufacturing process from being complicated.

Note that, in a case where the 2-port SRAM cells are arranged adjacent to each other in the X direction, the 2-port SRAM cells are arranged so as to be inverted in the Y direction. Further, in a case where the 2-port SRAM cells are arranged adjacent to each other in the Y direction, the 2-port SRAM cells are arranged so as to be inverted in the X direction.

Further, none of the nodes of the dummy transistors N23 to N26, P21, P22, P25, and P26 are connected to the local interconnects. Therefore, the dummy transistors N23 to N26, P21, P22, P25, and P26 do not affect the logic function of the 2-port SRAM cells. Note that the dummy transistors N23 to N26, P21, P22, P25, and P26 do not have to be formed in the 2-port SRAM cell of the present embodiment. However, by forming the dummy transistors N23 to N26, P21, P22, P25, and P26, it is possible to suppress manufacturing-attributed variations of the semiconductor memory devices, and improve the yield and the reliability of the semiconductor memory devices.

Further, although the line 71 that supplies the voltage VDD is provided in the M1 wiring layer, the line 71 may be provided in the buried wiring layer. Further, the line 71 may be provided in both the M1 wiring layer and the buried wiring layer. In this case, since the power source that supplies the voltage VDD is strengthened, the power source can be stabilized.

(Variation 1)

Figure 9:
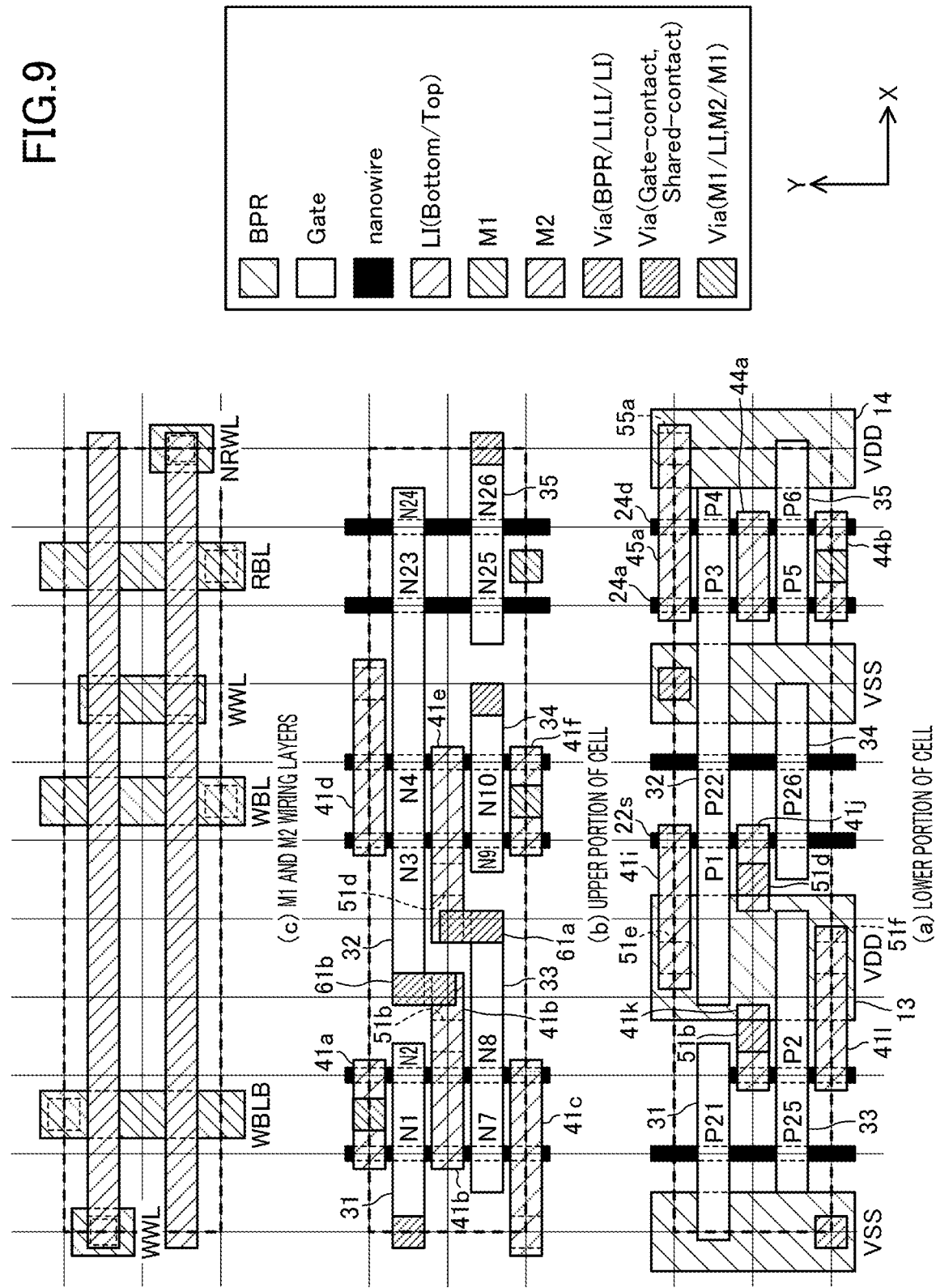
FIG. 9 is a plan view showing another exemplary layout configuration of the 2-port SRAM cell related to the second embodiment.

FIG. 9 is a plan view showing another exemplary layout configuration of the 2-port SRAM cell related to the second embodiment. Specifically, an illustration (a) of FIG. 9 shows a lower part of the cell, an illustration (b) of FIG. 9 shows an upper part of the cell, and an illustration (c) of FIG. 9 shows M1 and M2 wiring layers. In FIG. 9, N-type FETs are formed in the upper portion of the cell, and P-type FETs are formed in the lower portion of the cell. That is, the conductive types of the transistors formed in the upper portion and the lower portion of the cell are reversed from those of the 2-port SRAM related to the second embodiment.

Specifically, as shown in the illustration (a) of FIG. 9, power supply lines 13 and 14 extended in the Y direction are formed in the buried wiring layer. Power supply lines 13 and 14 supplies the voltage VDD.

Transistors P1 to P6, dummy transistors P21, P22, P25, and P26, and local interconnects 41i to 41l, 44a, and 44b are formed in the lower portion of the cell, and transistors N1 to N4, N7 to N10, dummy transistors N23 to N26, and local interconnects 41a to 41f are formed in the upper portion of the cell.

A local interconnect 45a extending in the X direction is formed in the lower portion of the cell. The local interconnect 45a is connected to pads 24a and 24d. The local interconnect 41i is connected to a pad 22s.

The local interconnect 45a is connected to the power supply line 14 through a contact 55a. The local interconnect 41i is connected to the power supply line 13 through a contact 51e. The local interconnect 41l is connected to the power supply line 13 through a contact 51f.

The local interconnect 41k is connected to a gate line 32 through a contact 51b, the local interconnect 41b, and a shared-contact 61b. The local interconnect 41j is connected to a gate line 33 through a contact 51d, the local interconnect 41e, and a shared-contact 61a.

This variation brings about effects similar to those of the 2-port SRAM cell related to the second embodiment.

(Variation 2)

Figure 10:
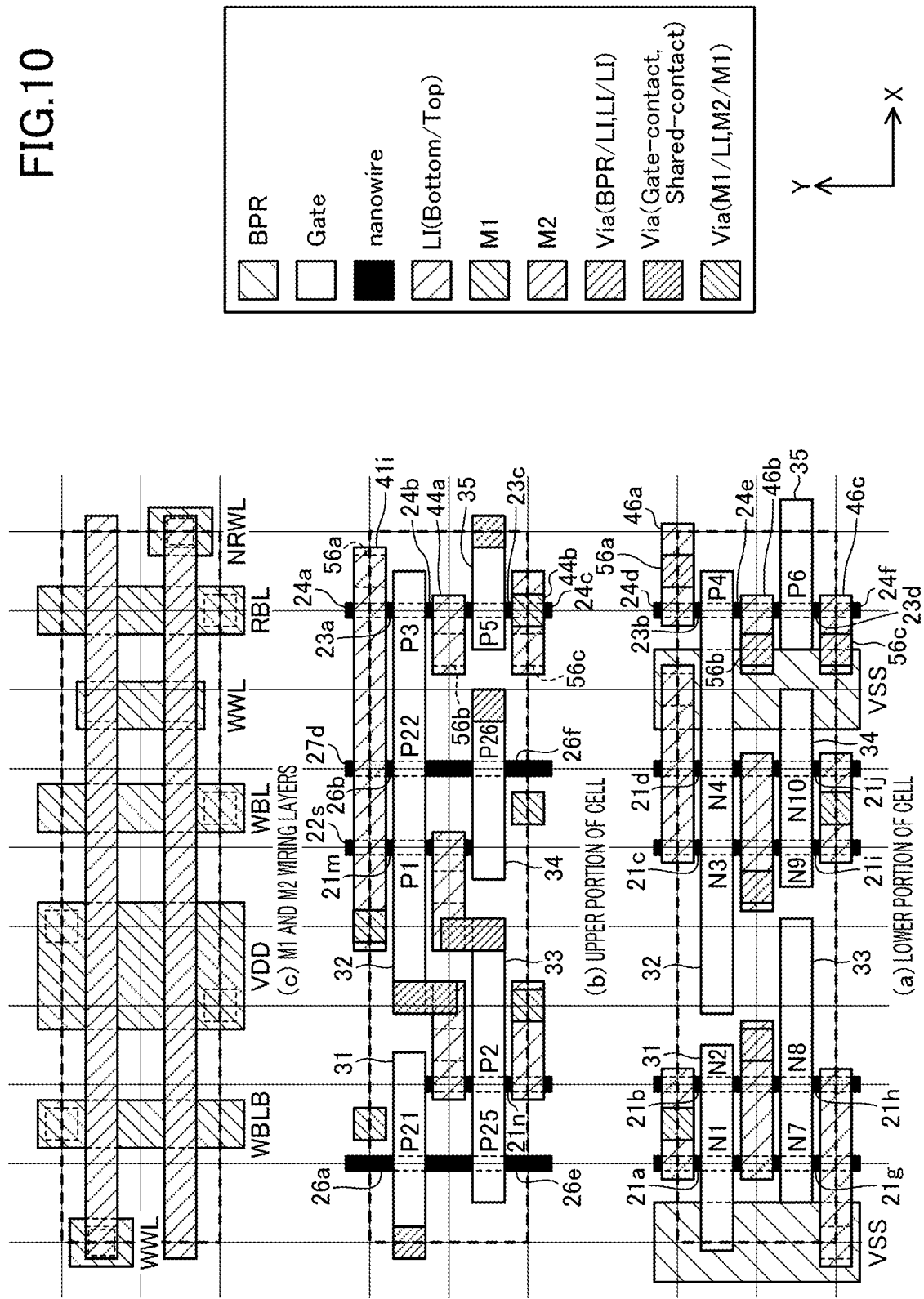
FIG. 10 is a plan view showing another exemplary layout configuration of the 2-port SRAM cell related to the second embodiment.

FIG. 10 is a plan view showing another exemplary layout configuration of the 2-port SRAM cell related to the second embodiment. Specifically, an illustration (a) of FIG. 10 shows a lower portion of the cell, an illustration (b) of FIG. 10 shows an upper portion of the cell, and an illustration (c) of FIG. 10 shows M1 and M2 wiring layers. In FIG. 10, transistors P4 and P6 are formed in the lower portion of the cell. The dummy transistors N23 to N26 are not formed.

Specifically, nanowires 23b and 23d are formed in the lower portion of the cell.

The nanowire 23b is formed so as to align with nanowires 21a to 21d in the X direction. The nanowire 23d is formed so as to align with nanowires 21g to 21j in the X direction. That is, the transistor P4 is formed so as to align with transistors N1 to N4 in the X direction. The transistor P6 is formed so as to align with transistors N7 to N10 in the X direction.

Further, the nanowires 23b and 23d overlap nanowires 23a and 23c, respectively, in plan view. That is, the transistors P4 and P6 overlap transistors P3 and P5, respectively, in plan view.

Local interconnects 46a to 46c extending in the X direction are formed in the lower portion of the cell. The local interconnect 46a is connected to a pad 24d. The local interconnect 46b is connected to a pad 24e. The local interconnect 46c is connected to a pad 24f.

Further, in the upper portion of the cell, a local interconnect 41i is connected to pads 22s and 24a and a dummy pad 27d. A local interconnect 44a is connected to a pad 24b. A local interconnect 44b is connected to a pad 24c.

The local interconnect 46a is connected to the local interconnect 41i through a contact 56a. The local interconnect 46b is connected to the local interconnect 44a through a contact 56b. The local interconnect 46c is connected to the local interconnect 44b through a contact 56c.

In this variation, the transistor corresponding to the read drive transistor RPD2 and the transistor corresponding to the read access transistor RPG2 are stacked. This variation brings about effects similar to those of the 2-port SRAM cell related to the second embodiment.

Further, the transistors P4 and P6 overlap the transistors P3 and P5, respectively, in plan view. That is, the transistors P4 and P6 are stacked on the transistors P3 and P5, respectively. This way, the area of the 2-port SRAM cell can be reduced.

Further, the transistors N1 to N4, N7 to N10, P4, and P6 are formed in the lower portion of the cell, and the transistors P1 to P3, and P5 and the dummy transistors P21, P22, P25, and P26 are formed in the upper portion of the cell. That is, the above configuration can be achieved by forming only the P-type FETs in the upper portion of the cell, and partially replacing the transistors formed in the lower portion of the cell with the P-type FET. This keeps the manufacturing process from being complicated.

(Variation 3)

Figure 11:
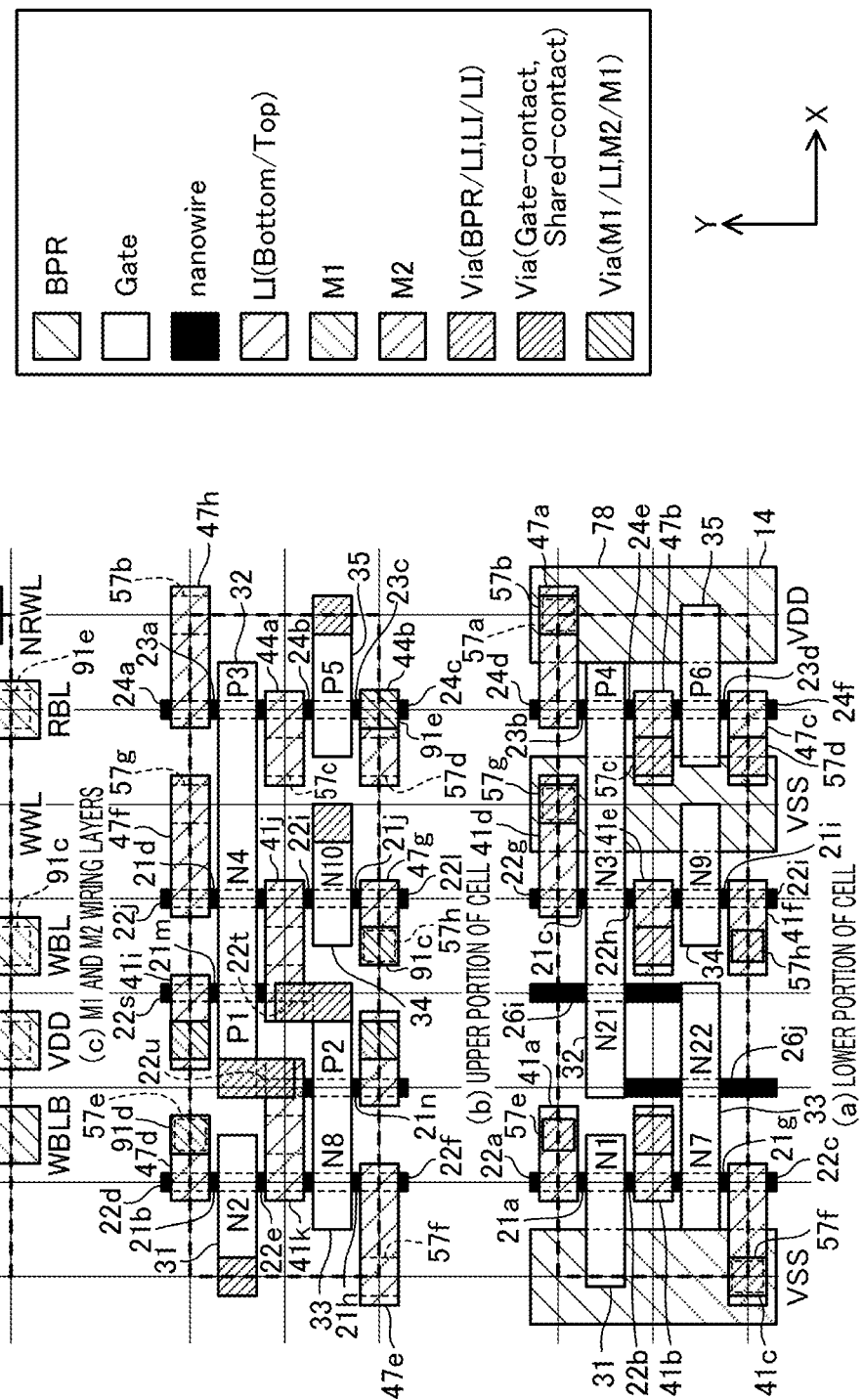
FIG. 11 is a plan view showing another exemplary layout configuration of the 2-port SRAM cell related to the second embodiment.

FIG. 11 is a plan view showing another exemplary layout configuration of the 2-port SRAM cell related to the second embodiment. Specifically, an illustration (a) of FIG. 11 shows a lower portion of the cell, an illustration (b) of FIG. 11 shows an upper portion of the cell, and an illustration (c) of FIG. 11 shows M1 and M2 wiring layers. In FIG. 11, transistors N2, N4, N8, and N10 are formed in the upper portion of the cell, and transistors P4 and P6 are formed in the lower portion of the cell. The dummy transistors N23 to N26, P21, P22, P25, and P26 are not formed.

Specifically, as shown in the illustration (a) of FIG. 11, a power supply line 14 that supplies the voltage VDD is formed in the buried wiring layer.

Nanowires 21b, 21d, 21h, and 21j are formed in the upper portion of the cell, and nanowires 23b, 23d, 26i, and 26j are formed in the lower portion of the cell.

The nanowires 21b and 21d are formed so as to align with nanowires 21m and 23a in the X direction. The nanowires 21h and 21j are formed so as to align with nanowires 21n and 23c in the X direction. The nanowires 23b and 26i are formed so as to align with nanowires 21a and 21c in the X direction. The nanowires 23d and 26j are formed so as to align with nanowires 21g and 21i in the X direction. That is, the transistors N2 and N4 are formed so as to align with the transistors P1 and P3 in the X direction. The transistors N8 and N10 are formed so as to align with the transistors P2 and P5 in the X direction. The transistor P4 and a dummy transistor N21 are formed so as to align with the transistors N1 and N3 in the X direction. The transistor P6 and a dummy transistor N22 are formed so as to align with the transistors N7 and N9 in the X direction.

Further, the nanowires 21b, 21d, 21h, 21j, 23a, and 23c overlap the nanowires 21a, 21c, 21g, 21i, 23b, and 23d, respectively, in plan view. The nanowires 21m and 21n overlap the nanowires 26i and 26j, respectively, in plan view. That is, the transistors N2, N4, N8, N10, P3, and P5 overlap the transistors N1, N3, N7, N9, P4, and P6, respectively, in plan view. The transistors P1 and P2 overlap the dummy transistors N21 and N22, respectively, in plan view.

Local interconnects 47a to 47c extending in the X direction are formed in the lower portion of the cell. The local interconnect 47a is connected to a pad 24d. The local interconnect 47b is connected to a pad 24e. The local interconnect 47c is connected to a pad 24f. A local interconnect 41a is connected to a pad 22a in the lower portion of the cell. A local interconnect 41b is connected to a pad 22b. A local interconnect 41c is connected to a pad 22c. A local interconnect 41d is connected to a pad 22g. A local interconnect 41e is connected to a pad 22h. A local interconnect 41f is connected to a pad 22i.

Local interconnects 47d to 47h extending in the X direction are formed in the upper portion of the cell. The local interconnect 47d is connected to a pad 22d. The local interconnect 47e is connected to a pad 22f. The local interconnect 47f is connected to a pad 22j. The local interconnect 47g is connected to a pad 22l. The local interconnect 47h is connected to a pad 24a. The local interconnect 41i is connected to a pad 22s in the upper portion of the cell. The local interconnect 41j is connected to the pads 22i and 22t. The local interconnect 41k is connected to pads 22e and 22u. The local interconnect 44a is connected to a pad 24b. The local interconnect 44b is connected to a pad 24c.

The local interconnect 47a is connected to the line 14 through a contact 57a, and connected to the local interconnect 47h through a contact 57b. The local interconnect 47b is connected to the local interconnect 44a through the contact 57c. The local interconnect 47c is connected to the local interconnect 44b through a contact 57d. The local interconnect 47d is connected to the local interconnect 41a through a contact 57e, and connected to the line 73 through a contact 91d. The local interconnect 47e is connected to the local interconnect 41c through a contact 57f. The local interconnect 47f is connected to the local interconnect 41d through a contact 57g. The local interconnect 47g is connected to the local interconnect 41f through a contact 57h, and connected to the line 72 through a contact 91c.

In this variation, transistors corresponding to the drive transistor PD1, transistors corresponding to the drive transistor PD2, transistors corresponding to the access transistor PG1, transistors corresponding to the access transistor PG2, transistors corresponding to the read drive transistor RPD2, and transistors corresponding to the read access transistor RPG2 are stacked. This variation brings about effects similar to those of the 2-port SRAM cell related to the second embodiment.

Further, the transistors N2, N4, N8, N10, P3, and P5 overlap the transistors N1, N3, N7, N9, P4, and P6, respectively, in plan view. That is, the transistors N2, N4, N8, N10, P3, and P5 are stacked on the transistors N1, N3, N7, N9, P4, and P6, respectively. This way, the area of the 2-port SRAM cell can be reduced. Since each transistor is stacked with another transistor, there is no need for, for example, partially removing the transistors. This keeps the manufacturing process from being complicated.

Further, the transistors N1, N3, N7, N9, P4, and P6 and the dummy transistors N21 and N22 are formed in the lower portion of the cell, and the transistors N2, N4, N6, N8, P1, P2, P3, and P5 are formed in the upper portion of the cell. That is, the above configuration can be achieved by partially replacing the N-type FETs formed in the lower portion of the cell with the P-type FET, and partially replacing the P-type FETs formed in the upper portion of the cell with the N-type FET. This keeps the manufacturing process from being complicated.

(Variation 4)

Figure 12:
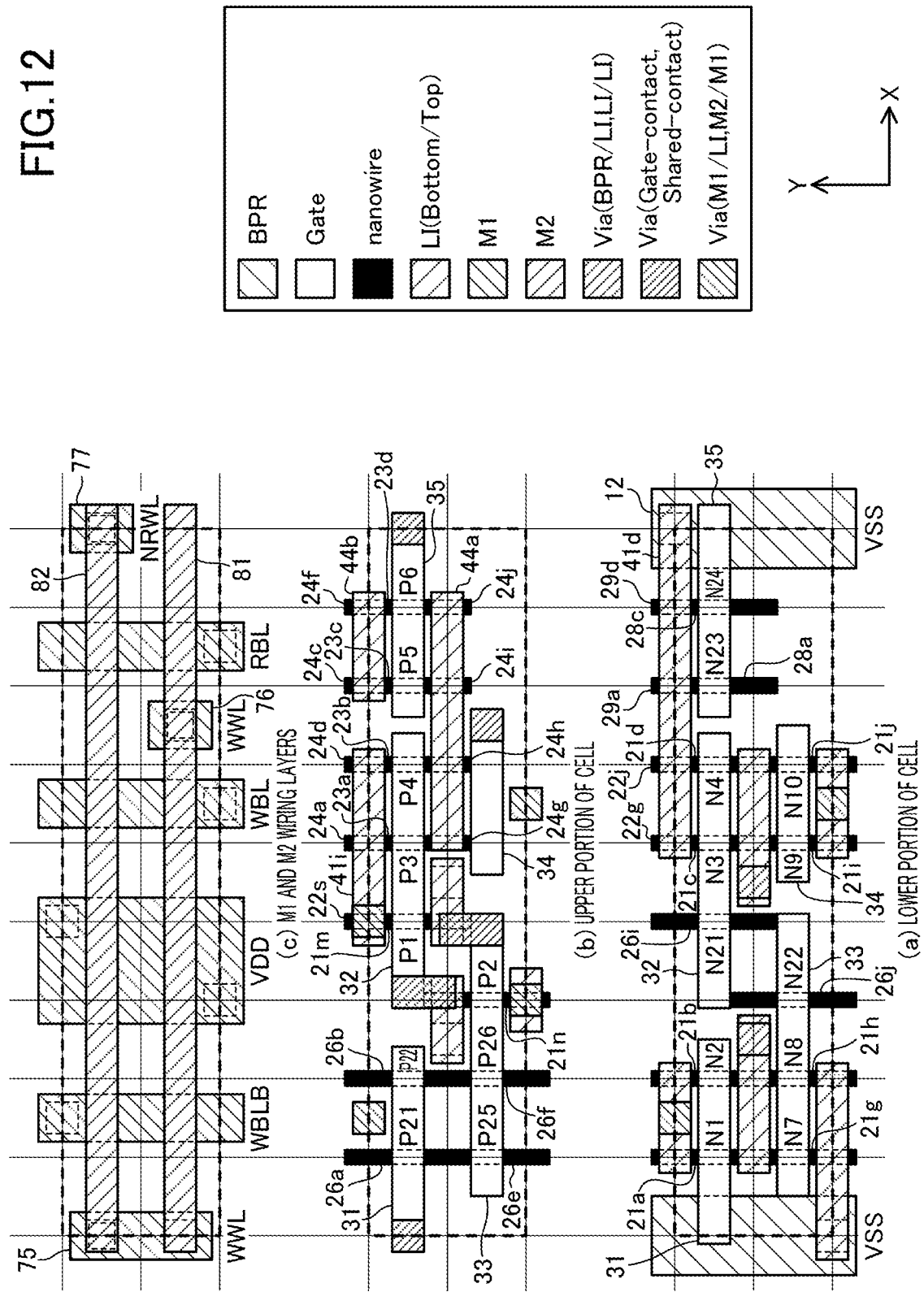
FIG. 12 is a plan view showing another exemplary layout configuration of the 2-port SRAM cell related to the second embodiment.

FIG. 12 is a plan view showing another exemplary layout configuration of the 2-port SRAM cell related to the second embodiment. Specifically, an illustration (a) of FIG. 12 shows a lower portion of the cell, an illustration (b) of FIG. 12 shows an upper portion of the cell, and an illustration (c) of FIG. 12 shows M1 and M2 wiring layers. In FIG. 12, transistors P3, P4, P5 and P6 are formed so as to align in the X direction, in the upper portion of the cell. Further, dummy transistors N25 and N26 are not formed in the lower portion of the cell.

As shown in the illustration (b) of FIG. 12, nanowires 23a to 23d are formed in the upper portion of the cell. The nanowires 23a to 23d are formed so as to align with nanowires 21m, 26a, and 26b in the X direction. Further, the nanowires 23a, 23b, 23c, and 23d overlap the nanowires 21c, 21d, 28a, and 28c, respectively, in plan view.

Nanowires 26i and 26j are formed in the lower portion of the cell and overlap the nanowires 21m and 21n in plan view. That is, the transistors P1 and P2 overlap dummy transistors N21 and N22 in plan view.

Further, a gate line 35 is formed so as to align with gate lines 31 and 32 in the X direction.

As shown in the illustration (b) of FIG. 12, pads 24g to 24j doped to the P-type semiconductor are formed at the lower ends of the nanowires 23a to 23d in the figure, respectively. That is, in FIG. 12, the nanowire 23a, the gate line 32, and the pads 24a and 24g constitute the transistor P3. The nanowire 23b, the gate line 32, and the pads 24d and 24h constitute the transistor P4. The nanowire 23c, the gate line 35, and the pads 24c and 24i constitute the transistor P5. The nanowire 23d, the gate line 35, and the pads 24f and 24j constitute the transistor P6.

That is, the transistors P3 to P6 overlap the transistors N3 and N4 and the dummy transistors N23 and N24, respectively, in plan view. Further, the transistors P3 to P6 are formed so as to align with the transistor P1 and the dummy transistors P21 and P22 in the X direction.

The local interconnect 41d is connected to the pads 22g and 22j and the dummy pads 29a and 29d. The local interconnect 41i is connected to the pads 22s, 24a, and 24d. The local interconnect 44a is connected to the pads 24g to 24j.

In this variation, the transistor corresponding to the read drive transistor RPD2 is stacked with the transistor corresponding to the drive transistor PD1. Further, the transistor corresponding to the read drive transistor RPD2 and the transistor corresponding to the read access transistor RPG2 are formed so as to align in the X direction. This variation brings about effects similar to those of the 2-port SRAM cell related to the second embodiment.

Further, the transistors P3 and P4 overlap the transistors N3 and N4 in plan view. That is, the transistors P3 and P4 are stacked on the transistors N3 and N4. The transistors P3 to P6 are formed so as to align in the X direction. This way, the area of the 2-port SRAM cell can be reduced.

It should be noted that each embodiment and variation described hereinabove deals with a case where each transistor includes one nanowire; however, a part of or all of the transistors may include a plurality of nanowires. In such a case, a plurality of nanowires may be arranged in the X direction or in the Z direction in plan view. Further, a plurality of nanowires may be arranged in both of the X direction and the Z direction. Further, the numbers of nanowires the transistor has in the upper and lower portions of the cell may be different.

In addition, in each of the above-described embodiments, the cross-sectional shape of the nanowire is substantially a square, but the cross-sectional shape of the nanowire is not limited to this. For example, the cross-sectional shape may be circular or rectangular shape.

Further, the above-described embodiments describe the nanowire FET as an exemplary three-dimensional transistor. However, the three-dimensional transistor is not limited to this. For example, the transistor formed in the lower portion of the cell may be a fin-type transistor.

INDUSTRIAL APPLICABILITY

With the present disclosure, a 2-port SRAM cell using a CFET can be achieved, and the area of the 2-port SRAM cell can be reduced.

DESCRIPTION OF REFERENCE CHARACTERS 11, 12, 13, 14 Power Supply Line
21a to 21u, 23a to 23d Nanowire
22a to 22v, 24a to 24j Pad
72 to 77, 81, 82 Line
N1 to N12, P1 to P6 Transistor
PU1, PU2 Load Transistor
PD1, PD2 Drive Transistor
PG1, PG2 Access Transistor
RPD1, RPD2 Read Drive Transistor
RPG1, RPG2 Read Access Transistor
WBL, WBLB Write-Bit Line
RBL Read-Bit Line
WWL Write-Word Line
RWL, NRWL Read-Word Line

The invention claimed is:

1. A semiconductor memory device, comprising a 2-port SRAM cell,
wherein the 2-port SRAM cell comprises:
a first transistor having one node connected to a first power source that supplies a first voltage, another node connected to a first node, and a gate connected to a second node;
a second transistor having one node connected to the first power source, another node connected to the second node, and a gate connected to the first node;
a third transistor having one node connected to the first node, another node connected to a second power source that supplies a second voltage different from the first voltage, and a gate connected to the second node;
a fourth transistor having one node connected to the second node, another node connected to the second power source, and a gate connected to the first node;
a fifth transistor having one node connected to a first write-bit line, another node connected to the first node, and a gate connected to a write-word line;
a sixth transistor having one node connected to a second write-bit line constituting a complementary bit line pair with the first write-bit line, another node connected to the second node, and a gate connected to the write-word line;
a seventh transistor having one node connected to the first power source, and a gate connected to the second node; and
an eighth transistor having one node connected to the other node of the seventh transistor, another node connected to a read-bit line, and a gate connected to a read-word line,
wherein each of the third to sixth transistors is a three-dimensional transistor of a first conductive type formed in a first layer,
wherein each of the first and second transistors is a three-dimensional transistor of a second conductive type different from the first conductive type, the three-dimensional transistor being formed in a second layer different from the first layer, and the first and second transistors at least partially overlapping the third and fourth transistors in plan view, respectively, and wherein the seventh and eighth transistors include the three-dimensional transistor of the second conductive type formed in the second layer, and are arranged to align in a first direction that is a direction in which channel portions of the first to eighth transistors extend.

2. The semiconductor memory device of claim 1, wherein each of the third to eighth transistors includes a plurality of three-dimensional transistors connected in parallel.

3. The semiconductor memory device of claim 1, wherein the first, second, third, and fourth transistors are arranged to align with the seventh, eighth, sixth, and fifth transistors, respectively, in a second direction perpendicular to the first direction.

4. The semiconductor memory device of claim 1, wherein the third and fifth transistors are arranged to align in the first direction, and the fourth and sixth transistors are arranged to align in the first direction.

5. The semiconductor memory device of claim 1, wherein the second layer is positioned higher than the first layer in a depth direction.

6. The semiconductor memory device of claim 1, wherein the seventh and eighth transistors each include:

a first three-dimensional transistor formed in the first layer; and a second three-dimensional transistor formed in the second layer so as to overlap at least partially the first three-dimensional transistor in plan view.

7. The semiconductor memory device of claim 1, wherein a same first gate line is directly connected to the gates of the first and third transistors, and a same second gate line is directly connected to the gates of the second and fourth transistors.

8. The semiconductor memory device of claim 1, wherein a same first gate line is directly connected to the gates of the third and seventh transistors.

* * * * *